United States Patent
Nakaya et al.

(10) Patent No.: US 7,423,461 B2
(45) Date of Patent: Sep. 9, 2008

(54) PHASE SYNCHRONOUS CIRCUIT

(75) Inventors: Hiroaki Nakaya, Kokubunji (JP);
Yasuhiko Sasaki, Tachikawa (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/631,976

(22) PCT Filed: Jul. 15, 2005

(86) PCT No.: PCT/JP2005/013152

§ 371 (c)(1),
(2), (4) Date: Aug. 13, 2007

(87) PCT Pub. No.: WO2006/018943

PCT Pub. Date: Feb. 23, 2006

(65) Prior Publication Data
US 2008/0048739 A1 Feb. 28, 2008

(30) Foreign Application Priority Data
Aug. 19, 2004 (JP) .............................. 2004-240015

(51) Int. Cl.
*H03L 7/00* (2006.01)
(52) U.S. Cl. ...................................... 327/144; 327/152
(58) Field of Classification Search ........................ None
See application file for complete search history.

(56) References Cited

U.S. PATENT DOCUMENTS

| 6,292,040 B1 * | 9/2001 | Iwamoto et al. ............. 327/158 |
| 6,396,322 B1 * | 5/2002 | Kim et al. .................... 327/158 |
| 6,919,745 B2 | 7/2005 | Lee et al. |
| 6,933,758 B2 * | 8/2005 | Kim et al. .................... 327/161 |
| 7,157,951 B1 * | 1/2007 | Morrison et al. ............. 327/263 |
| 7,253,670 B2 * | 8/2007 | Sasaki ......................... 327/161 |
| 7,259,601 B2 * | 8/2007 | Zarate et al. ................ 327/158 |
| 2005/0146365 A1 * | 7/2005 | Kim et al. .................... 327/161 |

FOREIGN PATENT DOCUMENTS

| JP | 2000-194438 A | 7/2000 |
| JP | 2001-197047 A | 7/2001 |
| JP | 2003-69424 A | 3/2003 |

OTHER PUBLICATIONS

Takanori Saeki et al. , "A 2.5-ns Clock Access, 250-MHz, 256-Mb SDRAM with Synchronous Mirror Delay" IEEE Journal of Solid-state Circuits, vol. 31, No. 11, Nov. 1996, pp. 1656-1668.

* cited by examiner

*Primary Examiner*—Cassandra Cox
(74) *Attorney, Agent, or Firm*—Miles & Stockbridge P.C.

(57) ABSTRACT

An external clock round-trips a round-trip delay block configured by a selector and a short delay array, and is made capable of corresponding to a wide frequency by generating a long delay time required for synchronization at the time of a low frequency operation. Further, when a plurality of phase comparators are disposed, in both cases where comparing phases all at once and comparing phases one after another, it is possible to complete the phase synchronization within a short time by making a delay amount variable.

10 Claims, 17 Drawing Sheets

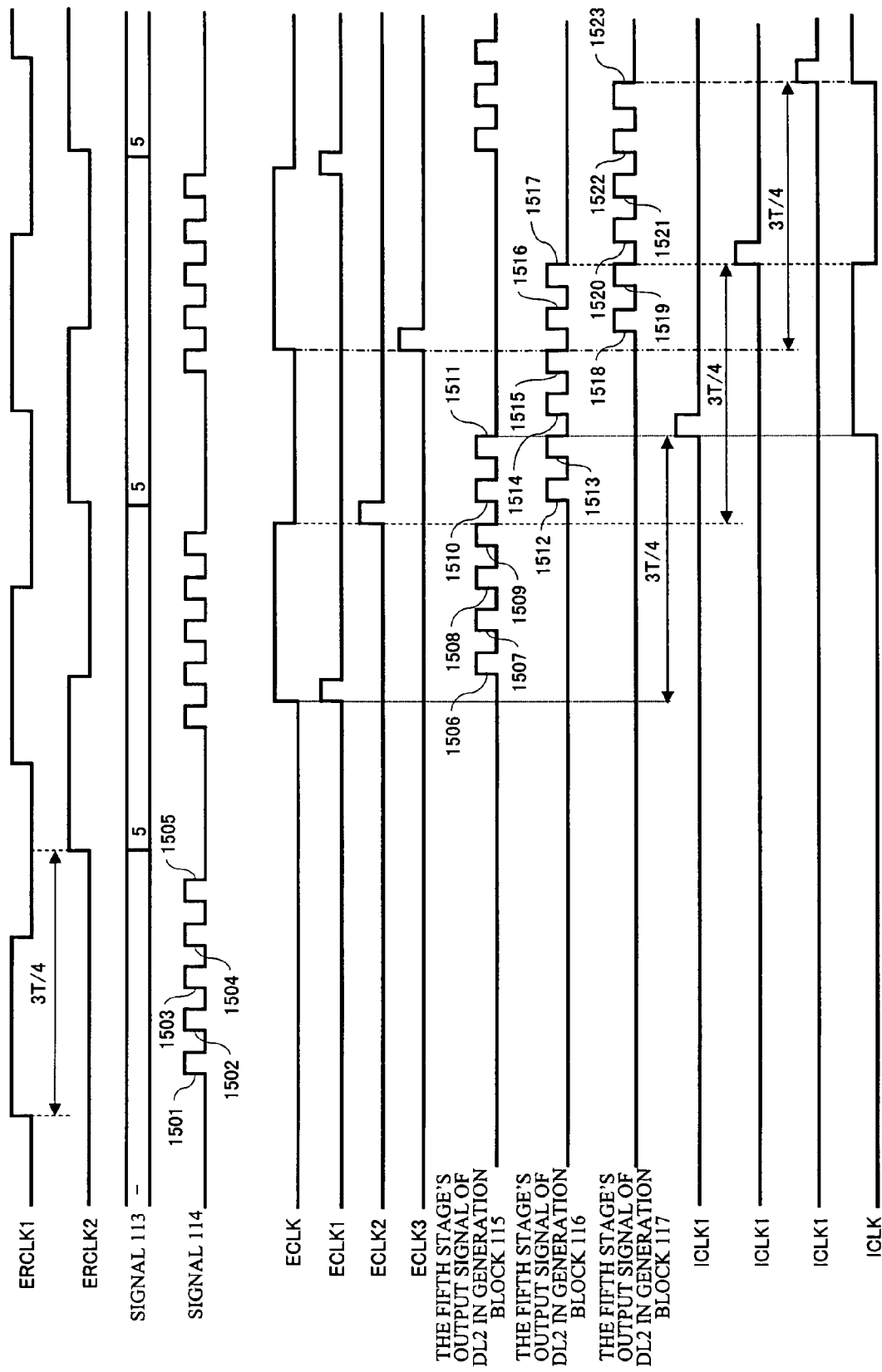

PHASE SYNCHRONOUS CIRCUIT

TECHNICAL FIELD

The present invention relates to a phase synchronous circuit. The phase synchronous circuit is used for a semiconductor integrated circuit, a circuit module, and a system that operate using a clock, a strobe, and the like. For example, it is used for a microprocessor, a microcontroller, a signal processing processor, an image processing processor, a speech processing processor, and a variety of memories or memory cards including volatile memories (DRAM, SRAM, and the like) and nonvolatile memories (flash memory and the like).

BACKGROUND ART

In general, a semiconductor chip is required to temporally synchronize signals of inside and outside of the chip in order to accurately exchange the signals with an external device. In such synchronization, an internal clock whose transition time is accurately controlled is generated so that a constant timing relationship with a transition time of a clock (or a strobe, it is mentioned as "clock" in the present application with no distinction made) inputted from the outside of the semiconductor chip is maintained, and usage of this chip internal clock to retrieve the signal is widely practiced. Now, with respect to such phase synchronous circuit, there exists a conventional technique as mentioned below.

In a non-patent document 1, two delay arrays (FDA and BDA) are arranged in parallel in opposite directions, and between thereof, a control circuit MCC is arranged in parallel with the two delay arrays. A load circuit having the same delay time as a clock driver connected to an output of the delay array BDA is pre-designed as a dummy, and is connected to an input of the delay array FDA. This circuit detects a position where a phase is synchronized within the delay array FDA from the delay array FDA and the control circuit MCC, and inputs a clock from the same position of the delay array BDA and transfer the clock in the opposite direction from that of the delay array FDA, so that a fast synchronization is realized in which the phase is synchronized in a delay of two cycles.

Further, in a patent document 1, a ring type coarse adjustment delay device to coarsely adjust a phase and a fine adjustment delay device to finely adjust a phase are provided to configure a ring type and a hierarchical type, so that an entire area of the circuit and the number of gates are reduced. A delay amount is determined such that phases with an external clock and a feedback clock are compared one after another by one phase detector, and from the result, increase and decrease of the delay amount is given to the fine adjustment delay device and the coarse adjustment delay device.

Non-Patent Document 1: IEEE Journal of Solid-state Circuits, Vol. 31, No. 11, November 1996, pp. 1656-1668

Patent Document 1: Japanese Patent Application Laid-Open Publication No. 2003-69424

DISCLOSURE OF THE INVENTION

A phase synchronous circuit is preferred to be able to shorten the time required to synchronize an internal clock with an external clock in phase. On the other hand, in order to reduce the cost of a semiconductor chip, the chip is preferred to be realized by having the smallest area as possible or by the small number of elements and gates. Further, the chip is preferred to operate by lower power (power of operation and standby).

The phase synchronous circuit shown in the non-patent document 1 has a problem in that when its frequency range is expanded, a circuit area becomes large. That is, to satisfy phase-matching accuracy which is required when an operating frequency is the highest, it is necessary to shorten the delay time of each of the delay stages within delay arrays. Hence, in order to synchronize a clock of a low frequency by using a delay stage of the delay time thus decided, the number of delay stages cannot help but increase. As a result, there has been a problem in that the number of elements and the number of gates are increased.

However, since the frequency ranges of the signal inputted to the semiconductor integrate circuit are expanding, it is difficult to re-design the phase synchronous circuit for each frequency man-hour wise. Thus, a phase synchronous circuit which is usable in a wide range of frequency is desired. That is, it is desired that the phase-matching accuracy and the frequency range of the phase synchronous circuit are made compatible, and an increase of the circuit area accompanied with this compatibility is suppressed as much as possible.

Further, the patent document 1, which was found by a patent search conducted after the completion of the present invention, has a common point with the present invention in that a ring type delay array is used. However, a DLL disclosed in the patent document 1 uses the ring type delay array only for the delay array for coarse adjustment. Further, since a phase comparison is performed one after another for each stage of a fine adjustment delay device by one phase detector, it likely takes a long time until the phase synchronization is achieved, and no consideration is given to the time required for the synchronization.

Thus, a phase synchronization circuit is desired, in which a high matching accuracy and a wide frequency range are made compatible, and a phase synchronization is completed with a short period of time, though it is a circuit in which an occupied area on the chip, the number of gates, and the power are small.

The above and other objects and novel characteristics of the present invention will be apparent from the description of this specification and the accompanying drawings.

The typical ones of the inventions disclosed in this application will be briefly described as follows.

A phase synchronous circuit of the present invention comprises: a first delay array; a first selector that selectively inputs either one of a first reference clock and an output of the first delay array to the first delay array; a plurality of phase comparators that perform a phase comparison between each delay stage included in the first delay array and a second reference clock; a second delay array; a second selector that selectively inputs either one of an external clock and an output of the second delay array to the second delay array; and an output control circuit that selectively outputs an output outputted from each delay stage of the second delay array as an internal clock, wherein the output control circuit grasps the number of round-trips and the number of stages of the first delay array which are required to make a delay signal of the first reference clock generated by the first delay array synchronize with the second reference clock, and outputs the delay signal of the external clock generated by the second delay array corresponding to the grasped number of round-trips and delay stages as the internal clock.

Alternatively, a phase synchronous circuit of the present invention comprises: a first delay array; a first selector that selectively inputs either one of a first reference clock and an output of the first delay array to the first delay array; a phase comparator that performs a phase comparison between a delay signal of the first reference clock made by the first delay array and a second reference clock; a delay control circuit that controls a delay amount of the delay signal inputted to the phase comparator; a second delay array; a second selector that selectively inputs either one of an external clock and an output of the second delay array to the second delay array; and an output control circuit that selectively outputs an output outputted from each delay stage of the second delay array as an internal clock, wherein the output control circuit grasps the number of round-trips and the number of stages of the first delay array which are required to make a delay signal of the first reference clock generated by the first delay array synchronize with the second reference clock, and outputs the delay signal of the external clock generated by the second delay array according to the grasped number of round-trips and delay stages as the internal clock, and wherein the delay control circuit variably controls a delay amount of the delay signal inputted to the phase comparator.

Incidentally, the first selector and the second selector, and the first delay array and the second delay array are preferably made the same regarding to the circuit configuration and the layout thereof so that the delay times thereof are the as much as possible. Further, as the first reference clock and the second reference clock, if the same reference clock is given, the external clock and the internal clock are synchronized by a time difference of one cycle.

In the present invention, since the number of cycles can be made small until synchronization, when a synchronous circuit is not used, it is also possible to reduce the power at the non-operating time by stopping the clock input itself. Furthermore, at this time, if a power source itself of the synchronous circuit is turned off, it is also possible to reduce the power at the system stand-by time by preventing leakage current.

The effects obtained by typical aspects of the present invention will be briefly described below.

A phase synchronous circuit capable of synchronizing at a high speed with a small number of elements and gates can be realized.

BRIEF DESCRIPTIONS OF THE DRAWINGS

FIG. 18 is a timing chart of the phase synchronous circuit; and

BEST MODE FOR CARRYING OUT THE INVENTION

Hereinafter, embodiments of the present invention will be described in detail with reference to the accompanying drawings. Note that components having the same function are denoted by the same reference symbols throughout the drawings for describing the embodiment, and the repetitive description thereof will be omitted.

Figure 1:
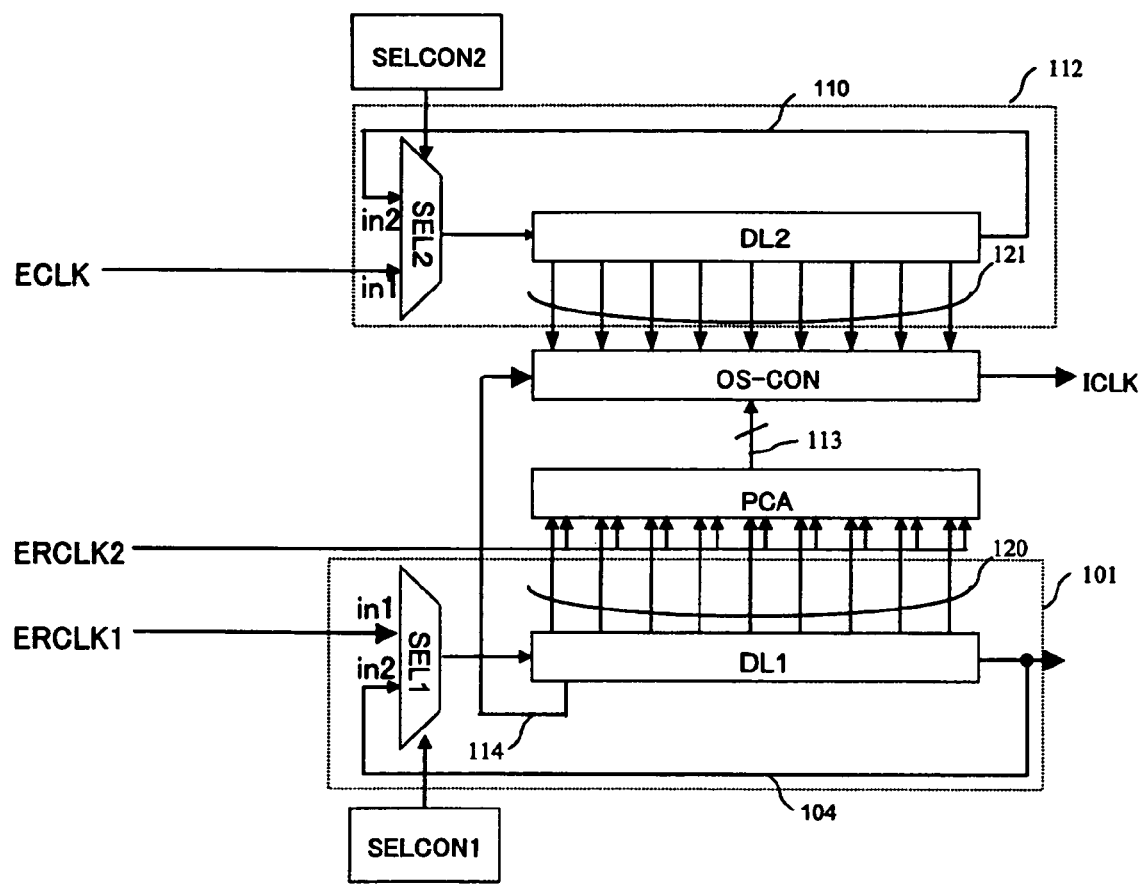
FIG. 1 is a view showing a phase synchronous circuit of the present invention.

First, FIG. 1 shows a basic configuration of a phase synchronous circuit of the present invention. The phase synchronous circuit shown in FIG. 1 is a circuit that outputs an internal clock ICLK so as to maintain a certain constant time (phase) relationship (time relationship (phase relationship) equal to a time difference (phase difference) between a first reference clock ERCLK 1 and a second reference clock ERCLK 2) with an external clock ECLK.

A first round-trip delay block 101 includes a selector SEL 1 taking the first reference clock ERCLK 1 as one input from among two inputs and a delay array DL1 taking a signal outputted from the selector SEL 1 as an input, and an output 104 of the delay array DL1 is connected to another input from among two inputs of the selector SEL1. The selector SEL1 selects which input signal should be outputted to the delay array DL1 by a first selector control circuit SELCON1. An output group 120 from each delay stage which configures the delay array DL1 is inputted into a phase comparator array PCA, so that a phase comparison with the second reference clock ERCLK2 is performed.

A second round-trip delay block 112 includes a selector SEL 2 taking the external clock ECLK as one input from among two inputs and a delay array DL2 taking a signal outputted from the selector SEL 2 as an input, and an output 110 of the delay array DL2 is connected to another input from among two inputs of the selector SEL2. The selector SEL2 selects which signal should be outputted to the delay array DL2 by a second selector control circuit SELCON2.

An output control circuit OS-CON is inputted with a signal 113 to designate a phase comparison result from a phase comparator array PCA and a signal 114 from the delay stage of a predetermined position of the delay array DL1. The output control circuit OS-CON decides the number of times by which the external clock ECLK is round-tripped by the second round-trip delay block 112 by counting the signal 114, and further, decides an output signal of which delay stage of the delay array DL2 should be outputted as an internal clock ICLK by the signal 113.

Incidentally, the delay array DL1 and the delay array DL2 are configured by a plurality of delay stages. The number of delay stages in the delay array is decided such that the time during which the signal passes through the selector SEL1 and the delay array DL1 is made shorter than a time difference between the reference clock ERCLK1 and the reference clock ERCLK2. In contrast to this, if the time in which the signal passes is longer than the time difference between the reference clocks, there is no need to allow the external clock to rotate.

Now, an operation of the circuit of FIG. 1 will be described. The first reference clock ERCLK1 is allowed to pass through the first round-trip delay block 101 configured by the selector SEL1 and the delay array DL for plural times, and further allowed to pass through the delay stages of the interiors of the selector SEL1 and the delay stages of the interior of the delay array DL1, so that a signal 120 adding the first reference clock ERCLK1 to an round-tripping portion and being delayed just by the passed delay stages is generated. Next, with respect to this delayed signal 120 and the second reference clock ERCLK2, a plurality of phase comparators existing in the interior of the phase comparator array PCA all at once compare the temporal contexts thereof, and each phase comparator determines that they have the same phases when they satisfy a certain condition. The information (hereinafter referred to as "the number of target round-trips" and "the number of target stages") on the number of signal passage round-trips of the first round-trip delay block 101 and the position (the number of stages) of the output from the delayed line DL1 are generated.

As a result, a total of the number of delay times that pass through the first round-trip delay block 101 by a number of target round-trips, and moreover, pass through the selector SEL1 and the number of target stages of the interior of the delay array can be made equal to the time difference (phase difference) between the two reference clocks.

The number of target round-trips and the number of target stages of the first round-trip delay block 101 thus decided are transferred to the output control circuit OS-CON. The output control circuit OS-CON performs a control such that the output from the delay array DL2 is outputted as the internal clock ICLK when the signal from an external clock ERCLK input round-trips around a second round-trip delay block 112 just by the number of target round-trips and passes through the selector SEL2 and the delay array DL2 just by the number of target stages.

Figure 2:
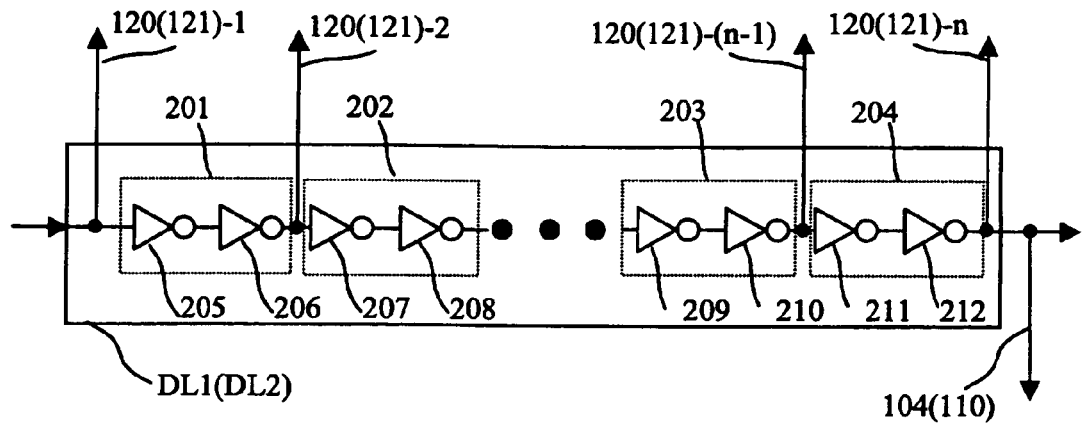
FIG. 2 is a view showing an example of a circuit configuration of a delay array.

FIG. 2 is a circuit example of the delay array DL1 or DL2, which is configured by a plurality of delay stages having a certain time's ticking and being connected in cascade. Each delay stage, if having a constant delay time, may be any type, but typically, it is often the case that it is a circuit connecting logic circuits (inverter circuit, NAND circuit, and the like) in cascade as a CMOS circuit or a circuit connecting differential amplifiers in cascade by a bipolar circuit. In the present embodiment, as such a system, an example of each delay stage 201 to 204 being configured by a CMOS inverter is shown.

Figure 3:
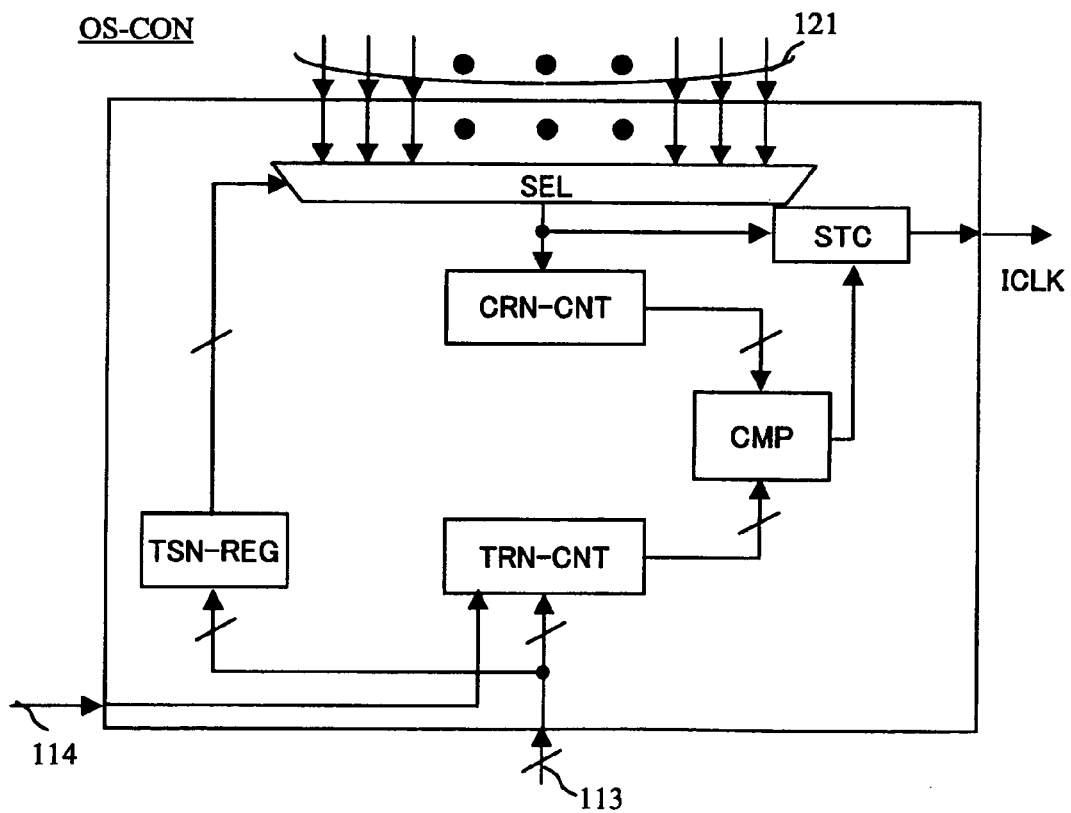
FIG. 3 is a view showing an example of a circuit configuration of an output control circuit.

FIG. 3 shows a configuration example of the output control circuit OS-CON. The output control circuit OS-CON is a circuit which takes an output 121 from each delay stage of the delay array DL2, an output 113 from the phase comparator array PCA, and an output 114 from a predetermined delay stage of the delay array DL1 as an input, and generates the internal clock ICLK.

The output control circuit OS-CON includes a target round-trip number counter TRN-CLT to measure and maintain the number of target round-trips necessary to delay the external clock ECLK by a predetermined time; a target stage number resister TSN-REG to maintain the number of target stages determined as matched by the phase comparator; a selector SEL that selects the output from the delay array DL2 whose number of target stages matches the value of the target stage number register; a current round-trip number counter CRN-CLT to measure and maintain the number of outputs from the selector SEL; a counter comparator CMP that detects matching of the values of each of the target round-trip number counter TRN-CLT and the current round-trip number counter CRN-CLT; and a signal transmission control circuit STC that controls the output from the selector SEL to be outputted to the outside by the matched signal generated by the counter comparator CMP.

The target round-trip number counter TRN-CLT measures how many times the first reference clock ERCLK1 is round-tripped around the first round-trip delay block 101 until the phase-matching with the delay signal of the first reference clock ERCLK1 and the second reference clock ERCLK2 is determined by the phase comparator array PCA, and maintain the same. Specifically, upon receipt of the output 114 from the predetermined delay stage of the delay array DL1, the counter TRN-CLT grasps a round-tripping state, and upon receipt of the output showing the phase matching from the phase comparator array PCA, decides the number of target round-trips, and maintains the same. At this time, the phase matching number of stages is maintained in the target stage number resister TSN-REG. The signal transmission circuit STC is controlled such that the decided number of target round-trips and the external clock ECLK delayed just by the number of target stages are outputted as the internal clock ICLK.

Figure 4A:
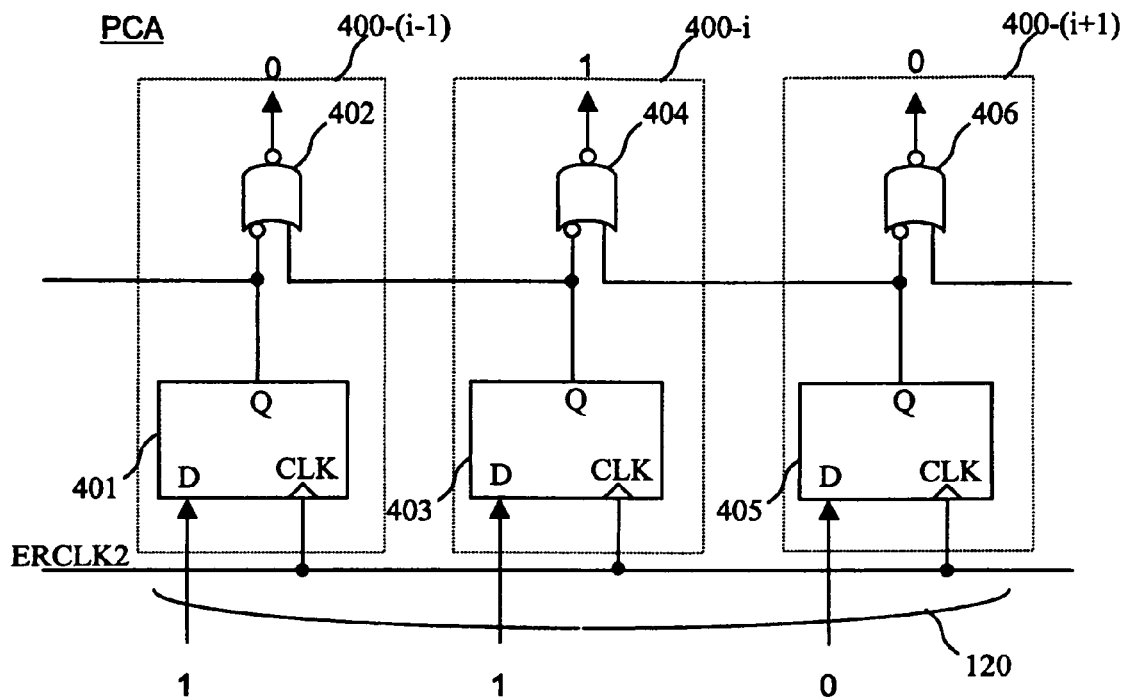
FIG. 4A is a view showing an example of a first circuit configuration of a phase comparator array.

FIG. 4A is a configuration example of the phase comparator array PCA. The phase comparator array PCA is repeatedly disposed with a phase comparison stage 400, and FIG. 4A shows three stages from among the outputs 120 from the delay array DL1. The phase comparison stage 400 is configured by a D flip flop 401 and a NOR logic circuit 402 in which one of the two inputs is inverted. A clock terminal CLK of the D flip flop is inputted with the second reference clock ERCLK2, and a data terminal D of the D flip flop is inputted with the delay signal 120 of the first reference clock ERCLK1 from each delay stage of the delay array DL1. The two inputs of the NOR logic circuit are inputted with an output Q from a flip flop of its own stage and an output Q from a flip flop adjacent at the right side, respectively.

Each flip flop, when the second reference clock ERCLK2 transits, outputs a value of 1 to an output Q if the output from the delay stage already moves to 1, and outputs a value of 0 to the output Q if the output from the delay stage does not transit to 1.

In a plurality of input units of the phase comparator array PCA, as shown in the figure, up to a certain position of the stage from the input side (left side in the figure), the signal is already propagated and becomes 1 when the second reference clock ERCLK2 transits as a clock of the flip flop, and at the subsequent stages, since no input from the delay array transits, the signal becomes 0. Consequently, the output of the flip flop corresponding to the delay stage that outputs the delay signal of the first reference clock ERCLK1 transiting at a timing by which the second reference clock ERCLK2 transits becomes 1 and the output of the flip flop adjacent at the right side becomes 0. Hence, in the phase comparator 400 shown in FIG. 4A, only the phase delay stage corresponding to the delay stage that outputs the delay signal synchronized with the second reference clock ERCLK2 outputs 1, and the other phase delay stages output 0.

Figure 4B:
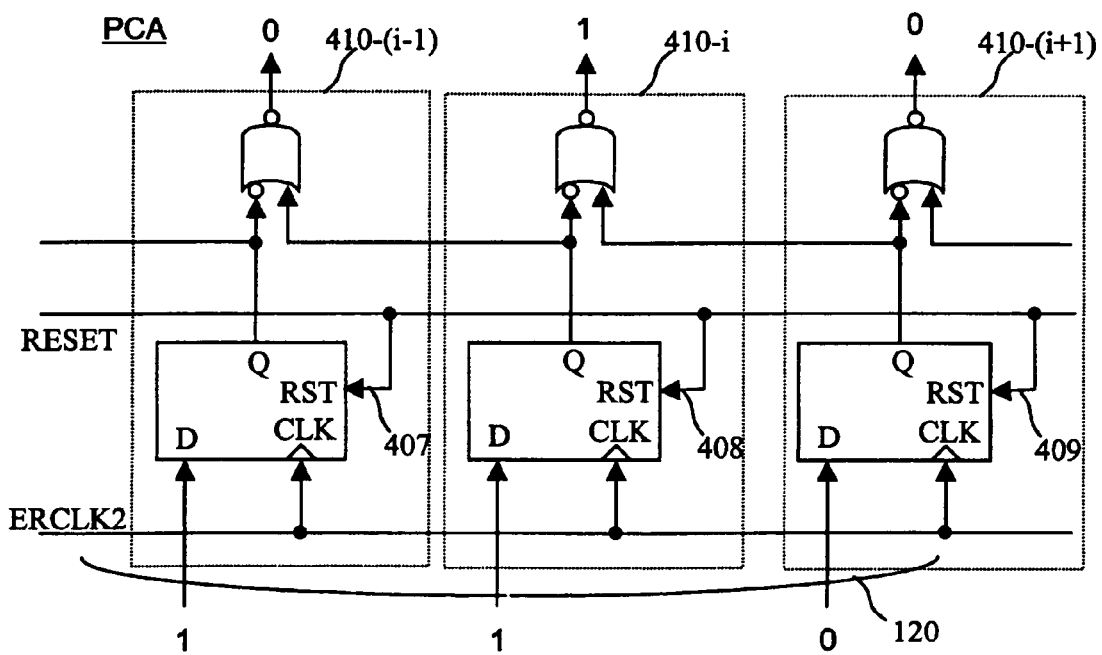
FIG. 4B is a view showing an example of a second circuit configuration of the phase comparator array.

Incidentally, FIG. 4B is a modified example of the phase comparator array PCA, which applies a reset (interruption) at a random timing so that all the outputs can be reset to 0. Such a resetting is performed after the synchronizing operation is completed in the phase synchronous circuit, and immediately after a power is inputted and immediately after the activation from a sleep and system resetting.

A control of a selector control circuit SELCON1 and a selector control circuit SELCON2 that control the selector SEL1 and the selector SEL2 positioned in the input unit of the first round-trip delay block 101 and the second round-trip delay block 112 in FIG. 1 will be described.

Although the selector control circuit SELCON1 controls the output of the selector SEL1, at first, it connects a first input (upper side of the selector SEL1) with the delay array DL1. A change over from the first input to a second input (lower side of the selector SEL1) is performed after the input passes through the selector SEL1 of the first reference clock ERCLK1.

Further, the change over from the second input to the first input is performed at either time after the phase synchronization (that is, when the phase comparator array PCA outputs a phase matching signal) is completed or during the time until the first reference clock ERCLK1 is inputted next.

Further, though the selector control circuit SELCON2 controls the output of the selector SEL2, at first, it connects a first input (lower side of the selector SEL2) with the delay array DL2. A change over from the first input to a second input (upper side of the selector SEL2) is performed after the input passes through the selector SEL2 of the second reference clock ERCLK2.

Further, the change over from the second input to the first input is performed at either time after the external clock ECLK Round-trips around the second delay round-trip block 112 just by the number of target round-trips controlled by the output control circuit OS-CON or during the time until the external clock ECLK is inputted next.

Figure 5:
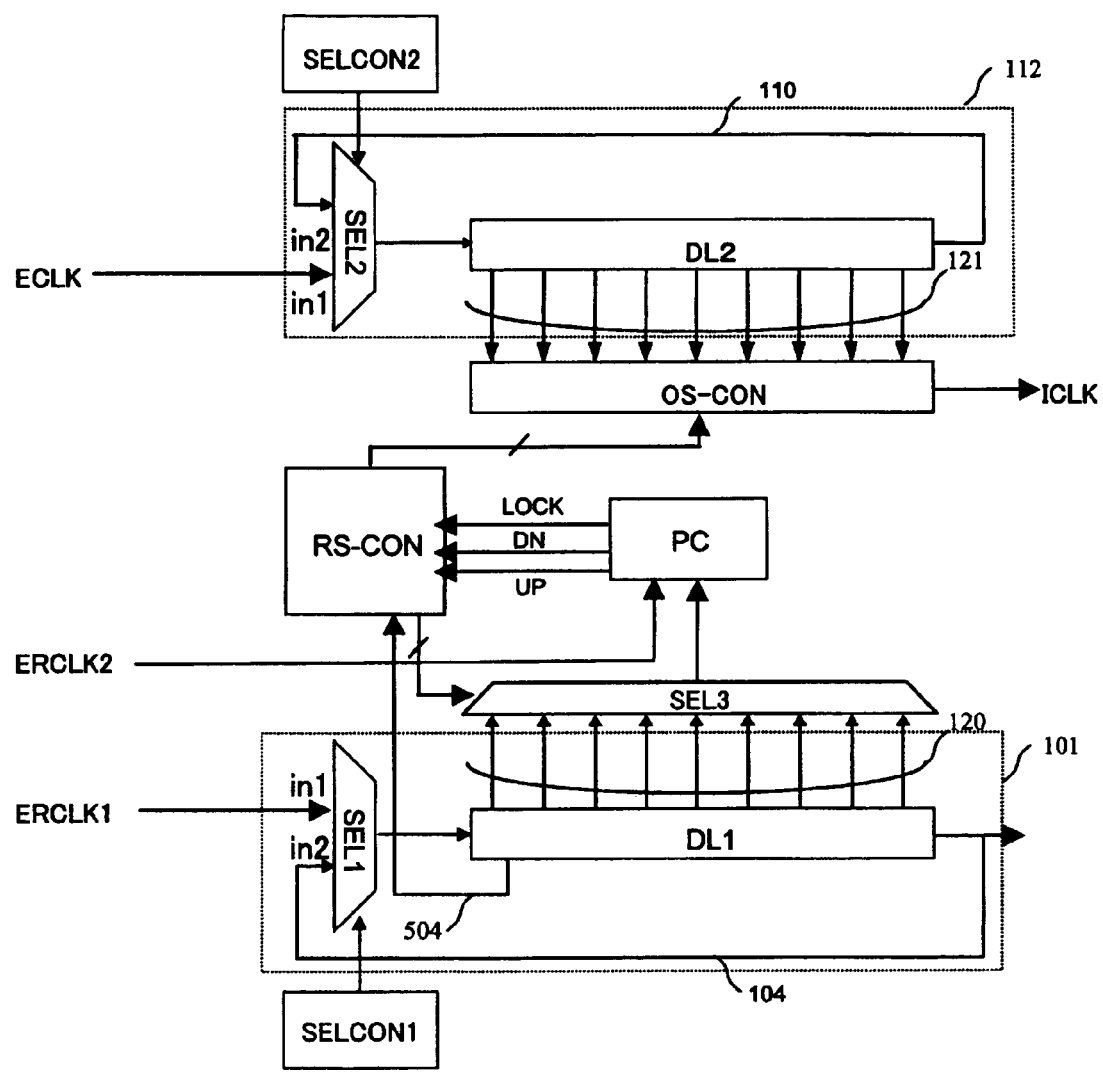
FIG. 5 is a view showing another phase synchronous circuit of the present invention.

FIG. 5 shows another configuration of the phase synchronous circuit of the present invention. This includes a selector SEL3 that selects one from a plurality of delay outputs from one phase comparator PC and the first round-trip delay block 101 in place of the phase comparator array PCA in FIG. 1. Which output is selected from the plurality of delay outputs 120 by the selector SEL3 is controlled by the control circuit RS-CON.

The phase comparator PC outputs either of a signal (DN signal) showing whether the phase of a signal selected by the selector SEL3 from the plurality of delay outputs 120 is advancing, a signal (UP signal) showing whether the phase is delayed, and a signal (LOCK signal) showing the phase-matching to the second reference clock ERCLK2. Since there exists only one phase comparator, the values of the number of target round-trips and the number of target stages start, for example, from 0 both in the number of target round-trips and the number of target stages, and each time the delay signal of the first reference clock ERCLK1 is inputted to the phase comparator PC, the number of target stages is increased by one each.

When this target stage number reaches the final stage number of the delay array DL1, the number of target round-trips is increased just by one, and the number of target stages is restored to 0 again, and each time the first reference clock ERCLK1 is inputted again, the number of target stages is increased by one each.

When the matching of the phase is detected, the number of target round-trips which is the number of times the first reference clock ERCLK1 round-trips around the first round-trip delay block 101 up to that time and the number of target stages which is the number of stages when the phase is matched are informed to an output control circuit OS-CON. Incidentally, the number of target round-trips and the number of target stages are not limited by the above described method, and for example, it is conceivable that the measurement is made by using a signal 504 from the predetermined position of the delay array DL1.

However, such a method of comparing from time to time and searching the synchronized number of stages requires a large number of cycles before the completion of the synchronization. Hence, the control circuit RS-CON variably increases or decreases a control of the number of target stages.

Figure 9:
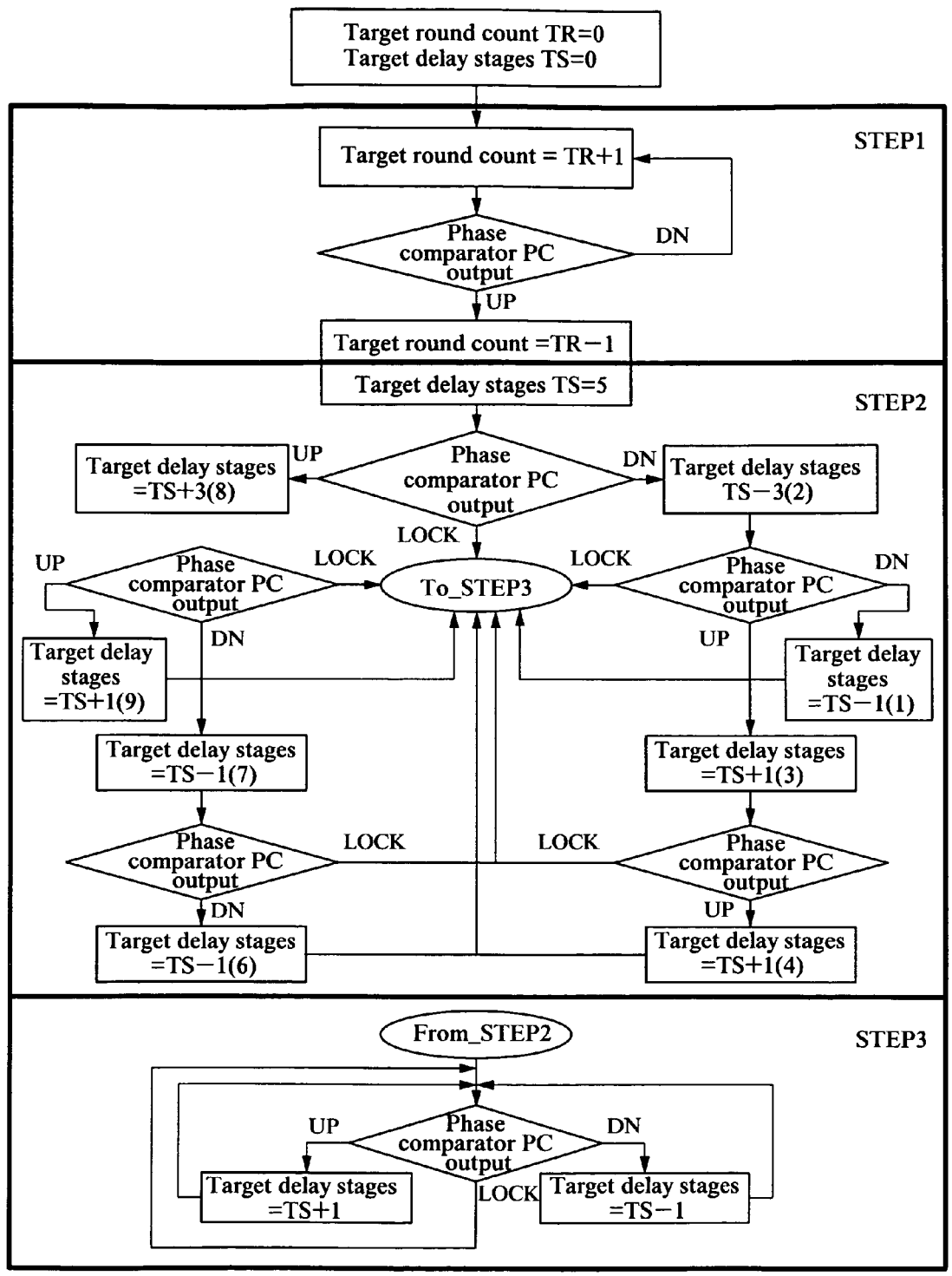
FIG. 9 is a flowchart in a case where a control width of the target number of stages is variable.

One mode of such variable stage number control is shown in FIG. 9. FIG. 9 is a flowchart to explain the operation as an example in the case where the number of stages of the delay array DL1 is ten. At first, both of a target round-trip number TR and a target stage number TS are initialized to 0 (S1).

After that, three operations of steps 1, 2, and 3 are executed. Step 1 performs a control of the target round-trip number TR. When the phase comparator PC emits the DN signal, the target round-trip number TR is increased just by 1 (S2 and S3). This is repeatedly performed until the UP signal is emitted, and when the UP signal is emitted, the target round-trip number TR is decreased just by 1 (S4), and the target round-trip number TR is decided.

Further, the target stage number TS is set to the predetermined number of stages (five stages which are half of the ten stages in the example of FIG. 9) (S4). Step S2 performs a control of the target stage number TS. After the target stage number TS is set to five stages, when the phase comparator PC emits the UP signal, the target round-trip number TR does not change, but the target stage number TS is added with three stages and becomes eight stages (S5 and S6).

Further, when the phase comparator PC emits the DN signal, the target round-trip number TR does not change, but the target stage number TS is decreased by three stages and becomes two stages (S5 and S7). Further, when the phase comparator PC emits a LOCK signal, the procedure proceeds to step 3 (S5 and S8).

After the target stage number TS are set to eight stages, when the phase comparator PC emits the UP signal, the target round-trip number TR does not change, but the target stage number TS is added with one stage and become 9 stages, and the procedure proceeds to step 3 (S9, S10, and S8).

Further, when the phase comparator PC emits the DN signal, the target round-trip number TR does not change, but the target stage number TS is decreased by one stage and becomes 7 stages (S9 and S11). Further, when the phase comparator PC emits the LOCK signal, the procedure proceeds to step 3 (S9 and S8).

Further, after the target stage number is set to seven stages, when the phase comparator PC emits the DN signal, the target round-trip number TR does not change, but the target stage number TS is reduced by one stage and becomes 6 stages, and the procedure proceeds to step 3 (S12, S13, and S8). On the other hand, when the phase comparator PC emits the LOCK signal, the procedure proceeds to step S3 (S12 and S8).

On the other hand, after the target stage number TS is set to two stages, when the phase comparator PC emits the UP signal, the target round-trip number TR does not change, but the target stage number TS is added with one stage and becomes three stages (S14 and S16).

When the phase comparator PC emits the DN signal, the target round-trip number TR does not change, but the target stage number TS is reduced by one stage and becomes one stage, and the procedure proceeds to step 3 (S14, S15, and S8). Further, when the phase comparator PC emits the LOCK signal, the procedure proceeds to step 3 (S14 and S8). Further, after the target stage number TS is set to three stages, when the phase comparator PC emits the UP signal, the target round-trip number TR does not change, but the target stage number TS is added with one stage and becomes four stages, and the procedure proceeds to step 3 (S17, S18, and S8). On the other hand, when the phase comparator PC emits the LOCK signal, the procedure proceeds to step 3 (S17 and S8).

Finally, at step 3, the following operation control is performed. When the phase comparator PC emits the UP signal, the target stage number TS is added with one stage, and the phase matching is checked again (S21 and S20), and when the DN signal is emitted, the number of target stages is reduced by one stage and the phase-matching is checked again (S22 and S20), and when the LOCK signal is emitted, no change is made (S20).

Incidentally, when this target stage number TS is the final stage number of the delay array DL1, in case the phase comparator PC emits the UP signal, the target round-trip number TR is added just by 1, and the target stage number TS is set to 0, then the phase-matching is checked.

On the other hand, when the target stage number TS is the minimum stage number (zero stage) of the delay array DL1, in case the phase comparator PC emits the DN signal, the target round-trip number TR is reduced just by 1, and the target stage number TS is set to the maximum number, then the phase-matching is checked.

Here, at step 2, though the number of stages to be controlled is reduced by 3 as well as 1 in incremental steps, it is not limited to this value. In this example, an attempt is made at quickening convergence by reducing the amount of the control to half.

Figure 6:
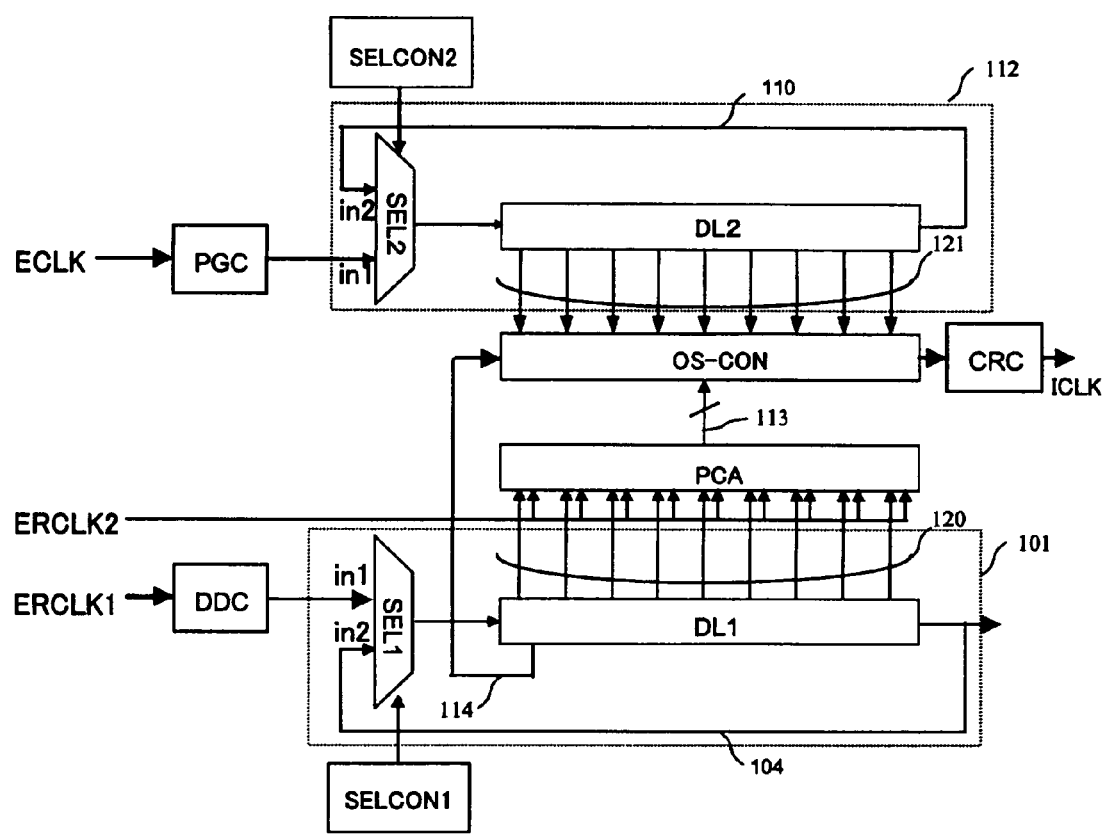
FIG. 6 is a view showing a modified example of the phase synchronous circuit of FIG. 1.

FIG. 6 is a view in which an input unit of the phase synchronous circuit shown in FIG. 1 is added with a pulse generating circuit PGC and a clock recovery circuit CRC and also a dummy delay circuit DDC for the compensation of the delay.

The pulse generating circuit PGC changes a duty ratio of a state "0" and a state "1" of the external clock ECLK. Typically, when the external clock ECLK has a duty ratio of 50%, it changes this duty ratio into smaller duty ratio (for example, it may be 10%, or not the ratio but a fixed time width).

As a result, the time of the state "1" originally owned by the external clock ECLK can be changed to be shorter. By so doing, when a signal round-trips the second delay round-trip block 112, it is possible to generate a pulse sufficiently shorter than the time required for one round-trip. As a result, a signal level in all the delay stages becomes a state "1", and subsequent inability of propagating the signal can be prevented.

The clock signal thus made smaller in the duty ratio is restored to the original ratio by the clock recovery circuit CRC. Further, by adding the pulse generating circuit PGC and the clock recovery circuit CRC in the route to the internal clock ICLK from the external clock ECLK, a static delay is generated, and therefore, a delay amount generated in the first delay round-trip block 101 may be made smaller as compared to the case where these circuits are not added. Hence, in consideration of this, the dummy delay circuit DDC is added to measure correct number of target round-trips and number of target stages by subtracting the static delay amount according the added circuits.

Figure 7:
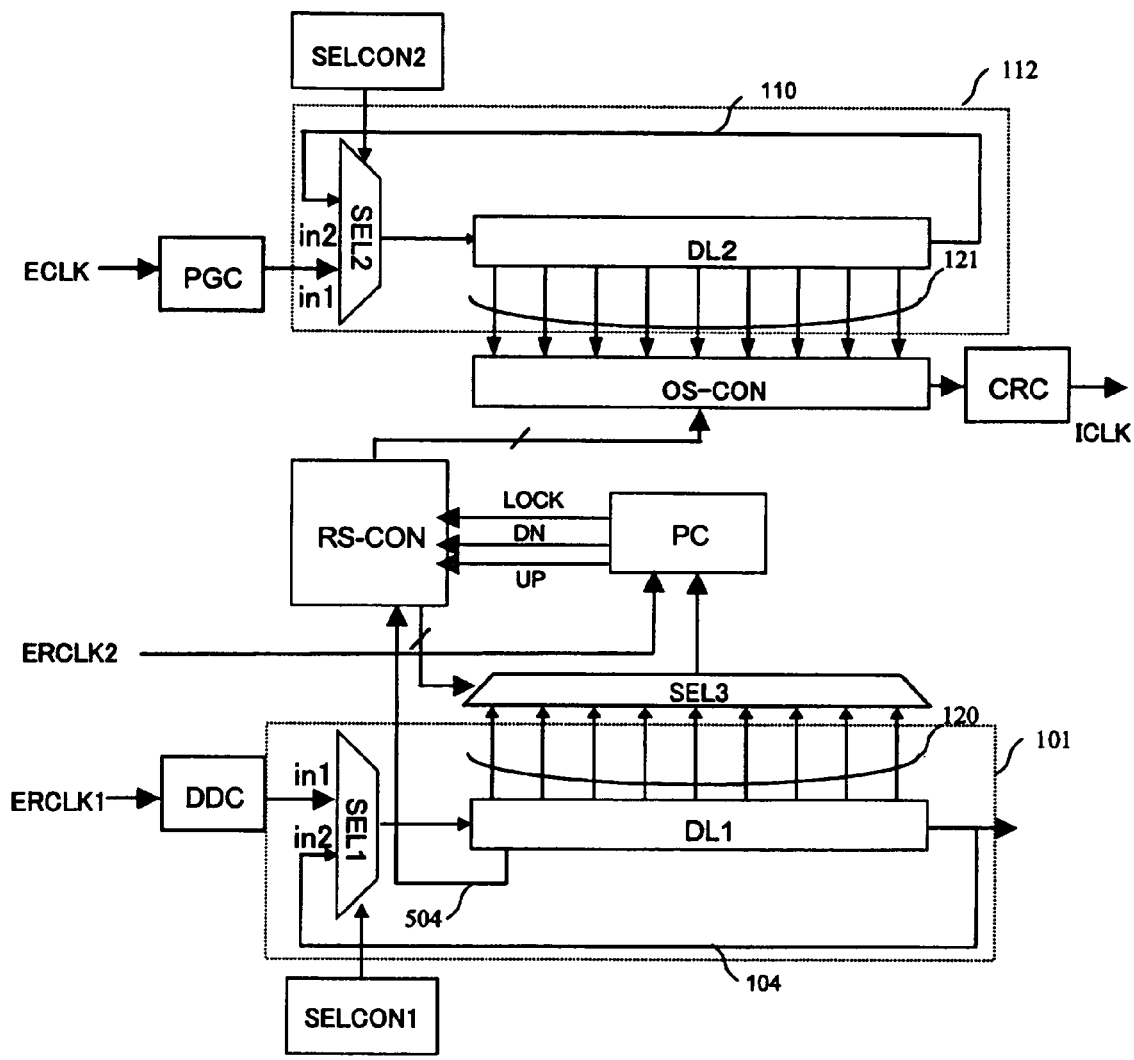
FIG. 7 is a view showing a modified example of the phase synchronous circuit of FIG. 5.
Figure 8A:
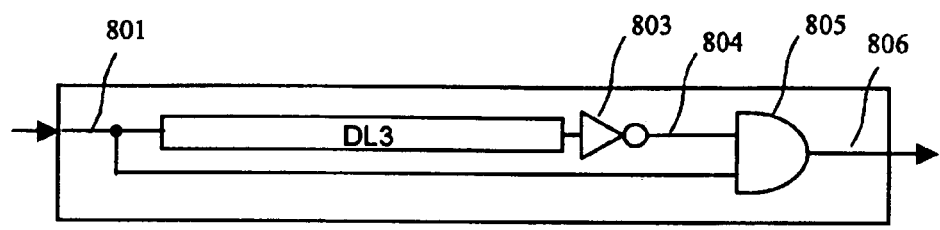
FIG. 8A is a view showing an example of a circuit configuration of a pulse generator circuit.

FIG. 7 is a view showing an example of the pulse generating circuit PGC, the clock recovery circuit CRC, and the dummy delay circuit DDC similarly added to the phase synchronous circuit shown in FIG. 5. FIG. 8A is a view showing an example of circuit configuration of the pulse generating circuit PGC shown in FIGS. 6 and 7.

In this circuit, a delay array DL3 that delays an input signal 801 is connected to a CMOS inverter 803. A logical add of the output signal 804 and the input signal 801 is generated by an AND element 805 so as to become an output 806. Now, the operation of this circuit is as follows.

That is, when the input 801 is 0 at first, the output signal 804 is in a state of 1, and therefore, the output is 0. Next, when the input 801 transits to 1, the output 806 of an AND logic becomes 1 since both of the two inputs are 1.

However, when the time elapses just by the delay amount of the delay array DL3, the output signal 804 transits to 0, and therefore, the AND logic becomes 0 and this is outputted. That is, a pulse that takes the time whose output is 1 as a signal passage time of the delay array DL3 is generated. Incidentally, the delay array DL3 may be any type of the delay element, and moreover, it is needless to say that the CMOS inverter may be any type of element if generates an inverted logic. For example, the delay array DL3 can be configured by series connection of the CMOS inverters.

Figure 8B:
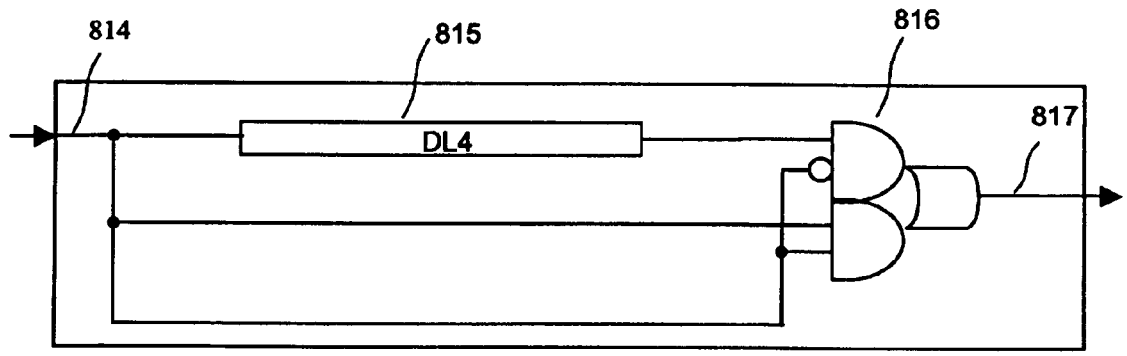
FIG. 8B is a view showing an example of a circuit configuration of a clock recovery circuit.

Further, FIG. 8B shows an example of circuit configuration of the clock recovery circuit CRC. At the rising time of a signal, the signal is outputted in a short period of time, while at the falling time of a signal, the signal is outputted in a long delay time, thereby elongating the pulse width. By changing the setting of the delay amount, it is possible to control the pulse width. Although a selector 816 shows an example configured by a CMOS decoding gate, any type of the selector may be usable if provided with functions as a selector.

Figure 10:
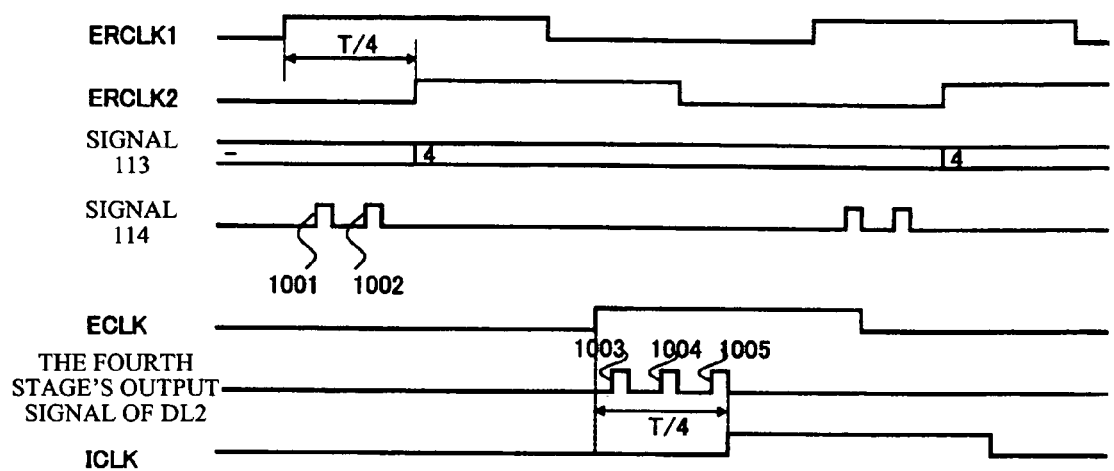
FIG. 10 is a timing chart of the phase synchronous circuit.

FIG. 10 is a timing chart of the phase synchronous circuit shown in FIG. 1, in which it is presumed that the first reference clock ERCLK1 and the second reference clock ERCLK2 are shifted just by one quarter of one cycle T of the clock.

The phase comparator array PCA outputs the signal 113 by a timing of the second reference clock ERCLK2, and the result of four stages is outputted, and this becomes the target stage number TS. The number of round-trips up to this time (when the second reference clock ERCLK2 is inputted) is counted by a signal 114, and this number of round-trips becomes the target round-trip number TR.

In this example, the number of round-trips is two. The output control circuit OS-CON is informed by the signals 113 and 114 of the result that the number of target stages is four and the number of target round-trips is two. Based on this result, when the signal from the external clock ECLK input round-trips around the round-trip delay block 112 just by two round-trips from the number of target round-trips, and after that, in the third round-trips, when it passes through just four stages from the number of target stages in the delay array DL2, a control is performed such that the output from the delay array DL2 is received by the output control circuit OS-CON, and is outputted as the internal clock ICLK having a time difference of one quarter of one cycle T from the external clock ECLK.

Figure 11:
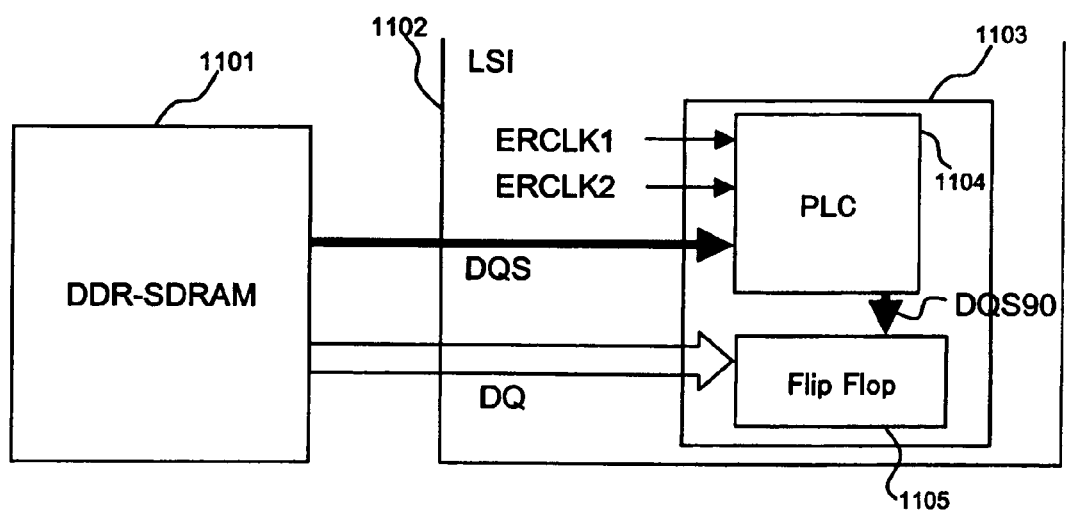
FIG. 11 is an example of a system configuration using a phase synchronous circuit of the present invention.

FIG. 11 is a block diagram showing a connection relationship between a DDR-SDRAM 1101 and an LSI 1102 as one of the applications of the phase synchronous circuit of the present invention. The DDR-SDRAM 1101 and LSI 1102 are connected through a memory interface 1103, and the interior of this memory interface 1103 is provided with a phase synchronous circuit 1104 that controls a phase for reading the data of the DDR-SDRAM 1101. By this phase synchronous circuit 1104, the LSI 1102 can surely read the data of the DDR-SDRAM 1101.

The above described embodiment is applied to the case where the pulse generating circuit (PGC) is used, and phase synchronization is performed by using one side edge of the clock.

Next, referring to the drawings, an embodiment will be described in detail on the case where, by using a pulse generating distribution circuit (PGDC1) and one side edge of the clock, integral multiples of the delay of one cycle is generated by the round-trip delay unit 112 only.

Figure 12:
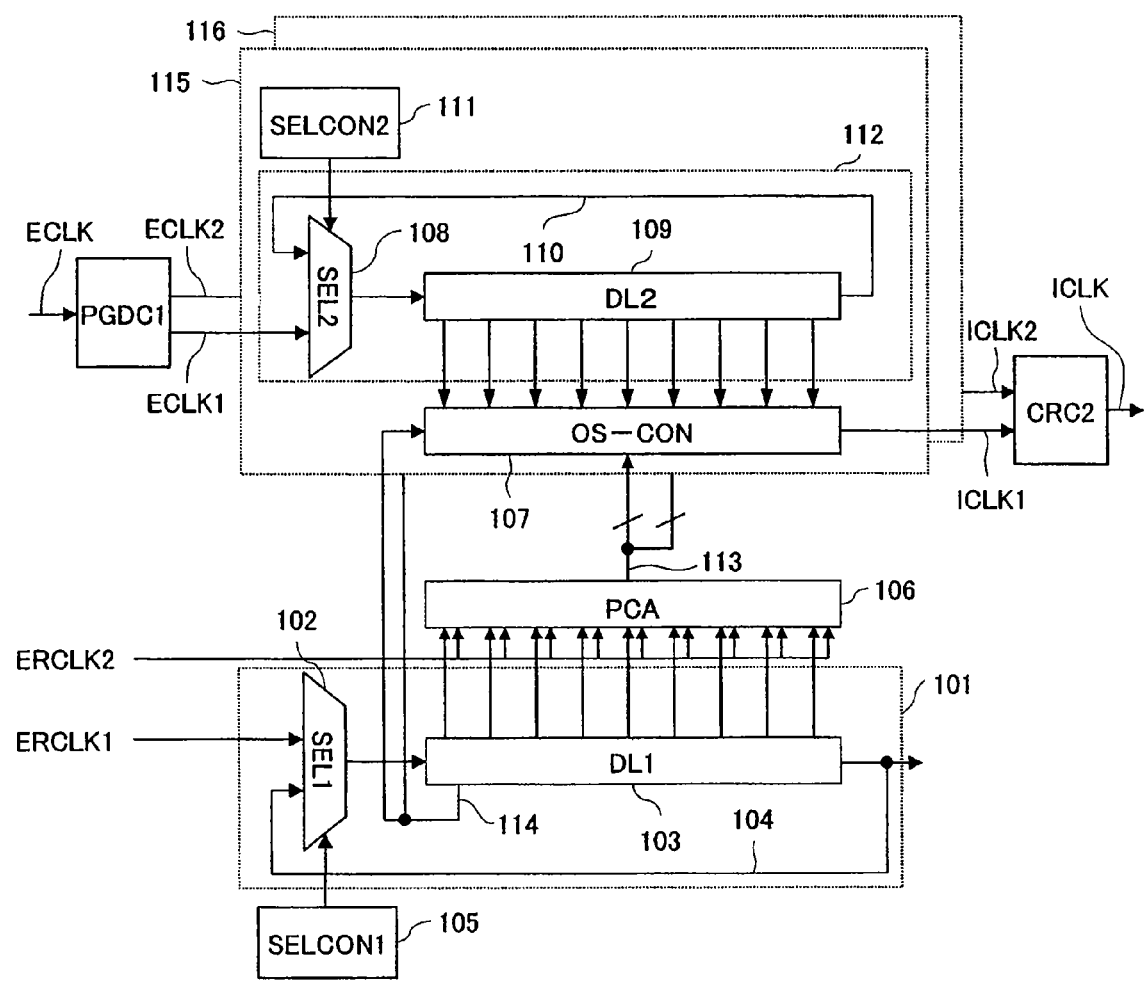
FIG. 12 is a view showing another phase synchronous circuit of the present invention.

FIG. 12 is a view of the embodiment corresponding to the case where, by using a generating block 115 in the phase synchronous circuit of the present invention and a generating block 116 having the same configuration as the generating block 115, integer multiples of the delay of one cycle is generated by the round-trips delay unit 112 only, thereby performing phase synchronization.

That is, a selector 102 (SEL1) which takes a reference clock (ERCLK1) as one input of two inputs and a delay array 103(DL1) which takes a signal outputted from the selector 102 as an input as shown in FIG. 12 are provided, and an output 104 of the delay array 103 is connected to another input of two inputs of the selector 102, and moreover, the selector 102 selects which input signal of the two inputs should be outputted by a selector control circuit 105 (SELCON1).

Further, the synchronous circuit of the present invention has the reference clock 2 (ERCLK2) and a phase comparator array 106 (PCA) which takes at least one from an output group from the delay stages configuring the delay array 103 (DL1) as an input, and a comparison result of the phases between the reference clock 2 and the input from the output group is outputted to output signal control circuits 107 (OS-CON) of the interior of the generating blocks 115 and 116 to be described below.

Further, the synchronous circuit of the present invention inputs an external clock to the pulse generating distribution circuit (PGDC1) to allow an internal clock ICLK to synchronize so as to maintain a certain constant time relationship (time relationship equal to a time difference between the reference clock 1 and the reference clock 2) with the external clock ECLK, and converts one side edge of the external input clock ECLK into a pulse, and moreover, those converted into the pulses are distributed the two generating blocks 115 and 116, respectively in order (ECLK1 and ECLK2), and based on the phase comparison result, the pulse signal distributed to each block is delayed, and each delayed signal (ICLK1 and ICLK2) is inputted to a clock recovery circuit (CRC2), and the clock is restored as the internal clock ICLK, and is outputted.

The pulse generating circuit of the interior of the pulse generating distribution circuit (PGDC1) changes a duty ratio of the states of 0 and 1 of the external input clock (ECLK). Typically, presuming that the external clock (ECLK) has a duty ratio of 50%, the pulse generating circuit changes this ratio to a smaller duty ratio (for example 10%). As a result, as compared to the time of the state 1 originally owned by the external clock (ECLK), it can be changed to the state 1 of much shorter time.

When, by so doing, the signal round-trips the round-trip delay block 112, a pulse sufficiently shorter than the time of one cycle can be generated, and for example, until a rising transition of the proceeding signal returns to the same position again, the signal on that position can be returned to the level (that is, 0) before the rising transition. This is to prevent a situation where if the signal does not return to the level before the rising transition, the signal level at all the positions becomes 1, and the propagation of the signal is unable to be performed subsequently.

On the other hand, the clock recovery circuit, if the duty ratio is thus smaller (10% here) than that (50% here) of the initial external input waveform, plays a work of restoring this ratio to the original ratio.

A description will be specifically made on the distribution pulse ECLK1 and the generating block 115 as an example.

A selector 108 which takes a pulse (ECLK1) inputted to the generating block 115 as one input of two inputs and a delay array 109 (DL2) which takes a signal outputted from the selector 108 as an input are provided, and an output 110 of the delay array 109 is connected to another input of the two inputs of the selector 108, and moreover, the selector 108 decides which one input signal of the two inputs should be outputted by a selector control circuit 111 (SELCON2).

Further, the output signal control circuit 107 (OS-CON) receives the signal 113 denoting a phase comparison result from the phase comparator array 106 (PCA) and the signal 114 from the predetermined position of the delay array 103 as an input.

Further, the pulse (ECLK1) distributed from the external clock selects at least one among the signals having passed through the delay array 109 and outputted from a plurality of places, and this selected signal is outputted by the output signal control circuit 107. Incidentally, though the delay arrays 103 and 109 are configured by a plurality of delay stages, the number of delay stages in the delay array is determined at this time such that the time during which the signal passes through the selector 102 and the delay array 103 becomes shorter than the time difference between the two reference clocks used in the present synchronous circuit.

Now, the operation of the above described configuration will be described below in detail.

That is, the signal is allowed to pass through the round-trip delay block 101 configured by the selector 102 and the delay array 103 plural times, and is further allowed to pass through the selector 102 and the internal delay stage of the delay array 103 for a certain number of stages, so that a signal in which the reference clock 1 (ERCLK1) is delayed just by a certain time is generated.

Next, this delayed signal and the reference clock 2 (ERCLK2) are all compared in temporal contexts thereof in a plurality of phase comparators existing in the interior of the phase comparator array 106, and when each phase comparator determines that they have the same phase by satisfying a certain condition, information (hereinafter called as the number of target round-trips and the number of target stages)on the signal passage round-trip number of the round-trip delay block 101 and the output positions (the number of stages) from the delay array 103 at the time when they have the same phases is generated.

As a result, a total of delay times of the signal passed through the round-trip delay block 101 several times (that is, the number of target round-trips), and moreover, passed through the selector 102 and the number of certain delay stages (that is, the number of target stages) of the interior of the delay array can be made equal to the time difference between the two reference blocks. Next, the number of target round-trips and the number of target stages of the round-trip delay block 101 thus decided are transmitted to each of the output signal control circuits 107 (OS-CON) of the generating blocks 115 and 116.

Describing on the example in the generating block 115, the output signal control circuit 107 performs a control in such a manner that when a signal from the pulse (ECLK1) distributed from the external clock rotates around the round-trip delay block 112 just by the number of target round-trips, and after that, passes through the number of target stages only in the delay array 109, the output from the delay array 109 is outputted as a delay signal (ICLK1) for generating the internal clock ICLK. The clock recovery circuit (CRC2) receives the outputs from the generating blocks 115 and 116, and recovers and outputs the internal clock ICLK.

In the interior of the phase comparator array 106, there exist a plurality of phase comparators, and each comparator compares the transition times of the signals between the output of each of the plurality of delay stages existing in the interior of the delay array 103 and the reference clock 2.

The number of output stages from the delay array 103 where both signals transit at the nearest timing is decided as the number of target stages. At the same time, the output control circuit 107 counts the number of signal passage round-trips of the round-trip delay block 101 up to that time, and this is outputted or stored as the number of target round-trips.

Figure 13:
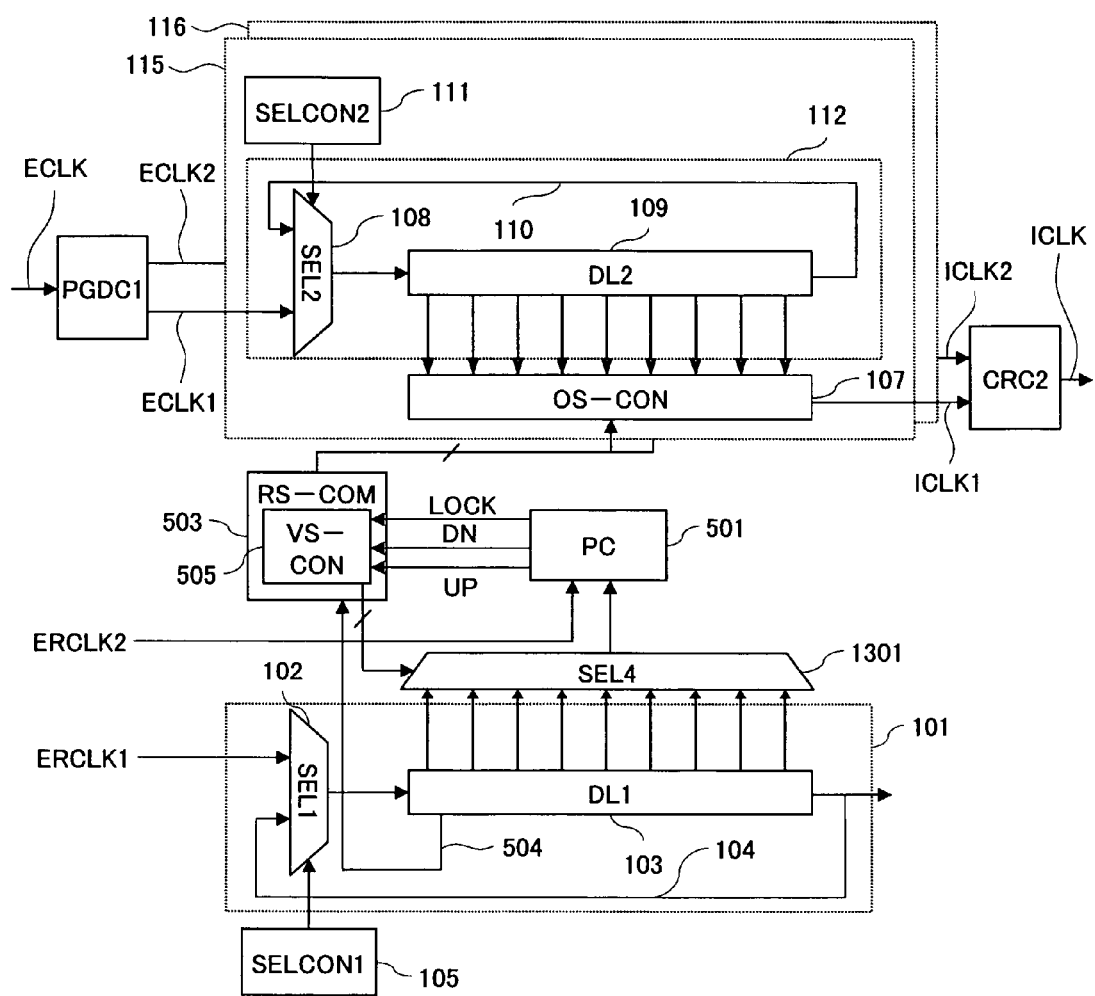
FIG. 13 is a view showing another phase synchronous circuit of the present invention.

FIG. 13 shows a basic configuration of another phase synchronous circuit according to the present invention. That is, here is shown one phase comparator 501 (PC) in place of the phase comparator array 106 (PCA) in FIG. 12.

In addition, a selector 1301 (SEL4) to select one from a plurality of delay outputs from the round-trip delay block 101 is provided. Which output from the plurality of delay outputs is selected by the selector 1301 is controlled by a control circuit 503 (RS-CON).

The phase comparator 501 outputs a signal showing whether a phase of the signal selected from the plurality of delay outputs is advancing or delayed (DN signal if advancing and UP signal if delayed) and the matching of phases (LOCK signal) to the reference clock 2.

Since there exists only one phase comparator, the values of the number of target round-trips and the number of target stages are successively operated. When the matching of phases is detected by the phase comparator, the number of target round-trips which are the result measured by using a signal 504 from the predetermined position of the delay array 103 as to how many round-trips the reference clock 1 round-tripped the round-trip delay block 101 up to that time and the number of target stages at the time when the phases matched are informed to the output control circuit 107.

However, since such an operation requires many cycles in the reference clock 1 until the completion of synchronization, it takes a long time, thereby posing a problem similar to the conventional technique. Hence, in the present invention, a control circuit 503 has a variable stage control circuit 505 in its interior, which does not increase or reduce controlling of the target stages one by one, but variably increases or reduces controlling of the target stages. This variable stage control circuit 505 was shown in the above described embodiment.

Figure 14A:
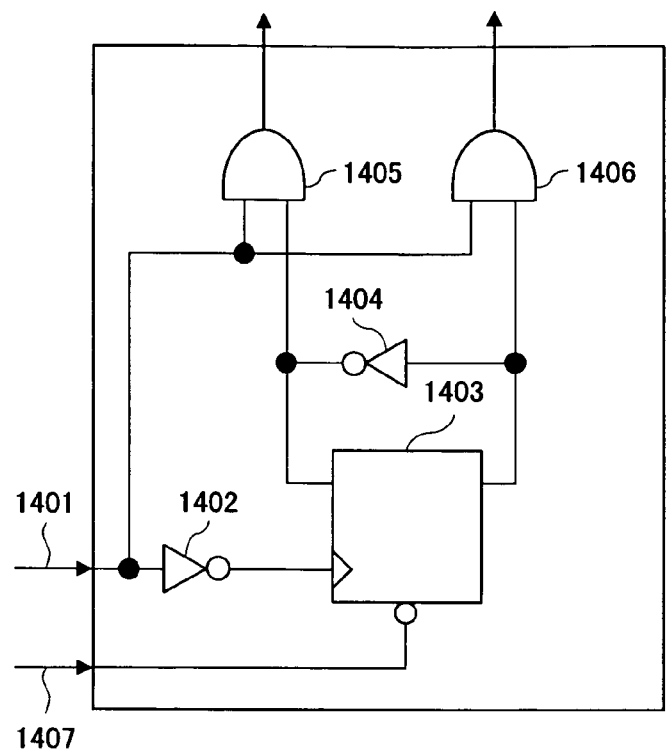
FIG. 14 is a view showing an example of a configuration of a pulse distribution circuit, and a configuration of a clock recovery circuit.
Figure 15:
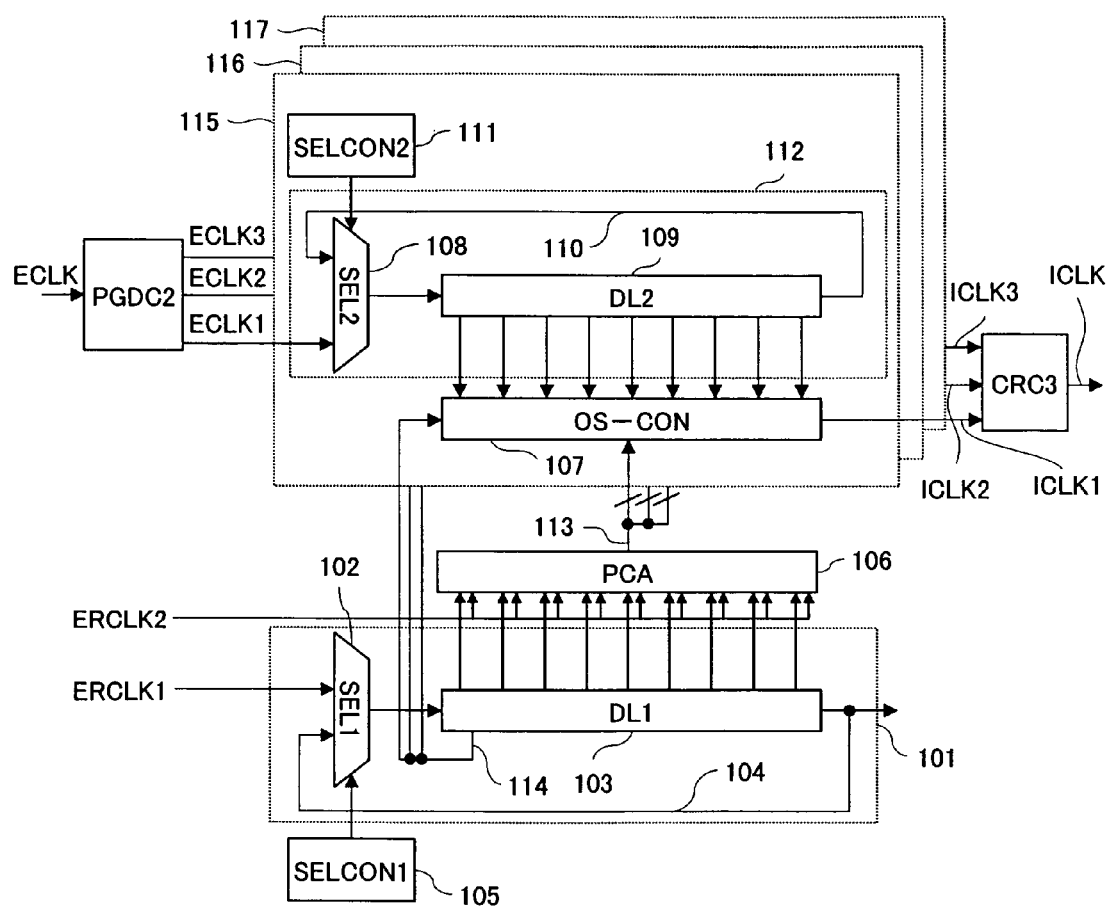
FIG. 15 is a view showing another phase synchronous circuit of the present invention.
Figure 16:
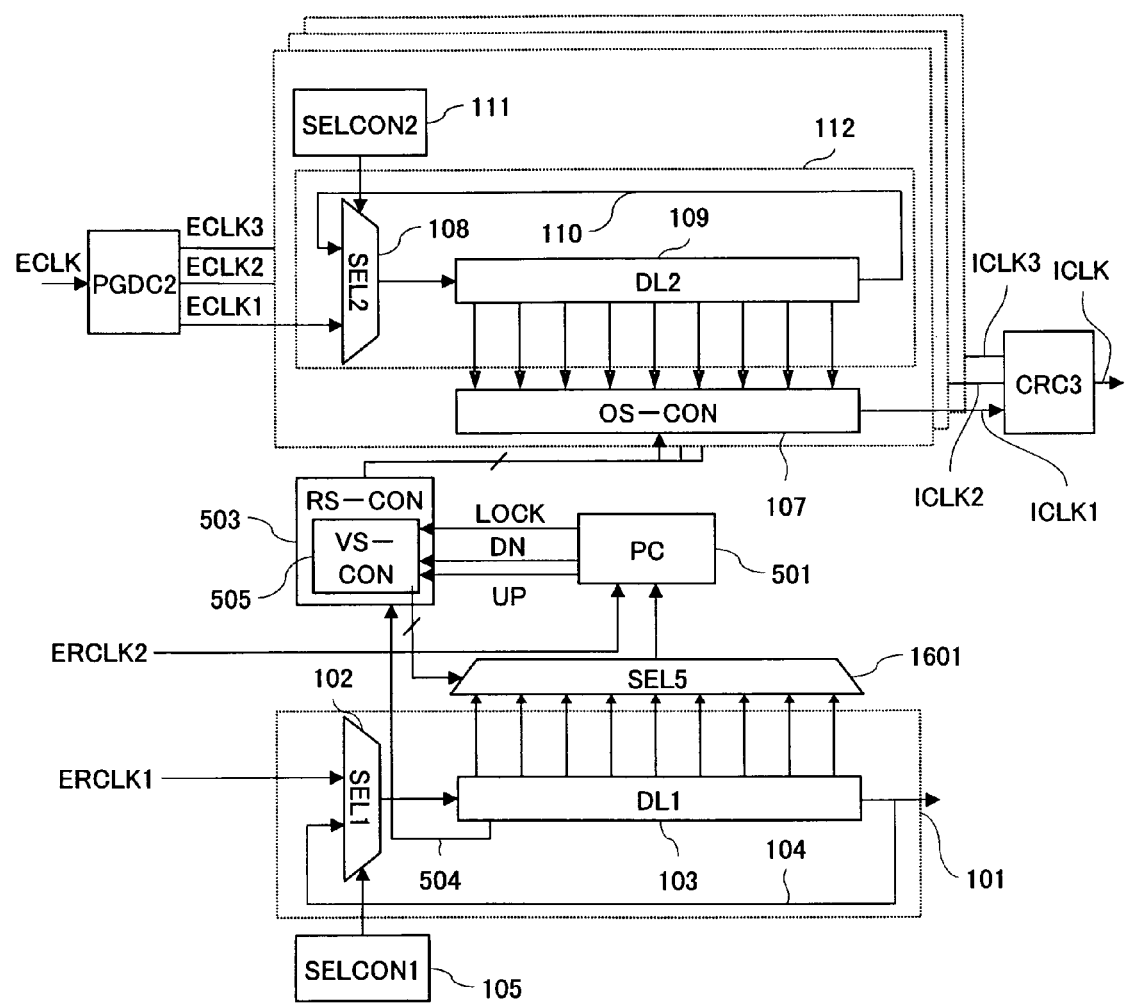
FIG. 16 is a view showing another phase synchronous circuit of the present invention.

FIG. 14A shows an embodiment of the signal distribution circuit of the interior of the pulse generating distribution circuit (PGDC1) shown in FIGS. 15 and 16.

An input signal 1401 is connected to one-sides of inputs of a CMOS inverter 1402 and AND elements 1405 and 1406. The input signal reversed by the CMOS inverter 1402 is inputted to a clock input of a flip flop block 1403.

The flip flop has the value of the output renewed when the value of the clock input transits to 1 from 0. When the input signal 1401 transits to 0 from 1, the output of the CMOS inverter 1402, that is, the clock input of the flip flop 1403 transits to 1 from 0.

At this time, the value of the output of the flip flop 1403 is renewed. The output of the flip flop 1403 is connected to the input of the CMOS inverter 1404 and another input of the AND element 1406.

The output of the CMOS inverter 1404 is connected to a data input of the flip flop 1403 and another input of the AND element 1405. When the value of an input 1407 transits from 1 to 0, the value of the output of the flip flop 1403 is reset and becomes 0. At this time, since the input of the CMOS inverter 1404 is inputted with 0, the value of the output becomes 1, and the data input of the flip flop 1403 is inputted with 1.

As a result, each time the value of the input 1401 transits from 1 to 0, the value of the output of the flip flop 1403 transits to 0, 1, 0, and 1 in order, and the AND elements 1405 and 1406 are correspondingly put into a state in which the input 1401 can be outputted.

Now, the operation of this circuit becomes as follows. That is, when the input 1407 is 1 at first, and then, transits to 0 after some times elapse, the value of the output of the flip flop 1403 is reset to 0. As a result, the value of the output of the CMOS inverter 1404 becomes 1, and the data input of the flip flop 1403 and the input of one side of the AND element 1405 are inputted with the value of 1.

Further, since the input of the one side of the AND element 1406 is inputted with 0, the input 1401 connected to the other input of the AND element 1406 is put into a state in which no output is made possible. On the other hand, the AND element 1405 has the input of its one side inputted with 1, and is in a state in which the input 1401 connected to the other side can be outputted. That is, the input 1401 passes through the AND element 1405 only from among the two connected AND elements, and is outputted.

Next, when the value of the input 1401 transits from 1 to 0, the value of 1 inputted to the data input of the flip flop 1403 is outputted, and is inputted to the input of the CMOS inverter 1404 and the input of one side of AND element 1406.

As a result, the AND element 1406 is put into a state in which the input 1401 can be outputted. Further, the value of the output of the CMOS inverter 1404 becomes 0, and this value is inputted to the data input of the flip flop 1403 and the input of one side of the AND element 1405. That is, the input 1401 passes through the AND element 1406 only from among the two connected AND elements, and is outputted.

Next, when the value of the input 1401 transits from 1 to 0, the value of 0 inputted to the data input of the flip flop 1403 is outputted, and is inputted to the input of one side of the CMOS inverter 1404 and the input of one side of the AND element 1406.

As a result, the out of the CMOS inverter 1404 becomes 1, and the AND element 1405 is put into a state in which the input 1401 can be outputted. That is, the input 1401 passes through the AND element 1405 only from among the two connected AND elements, and is outputted. Thus, according to the input 1401, the series of this operation is repeated, and the input 1402 is distributed in order to the two outputs.

Figure 14B:
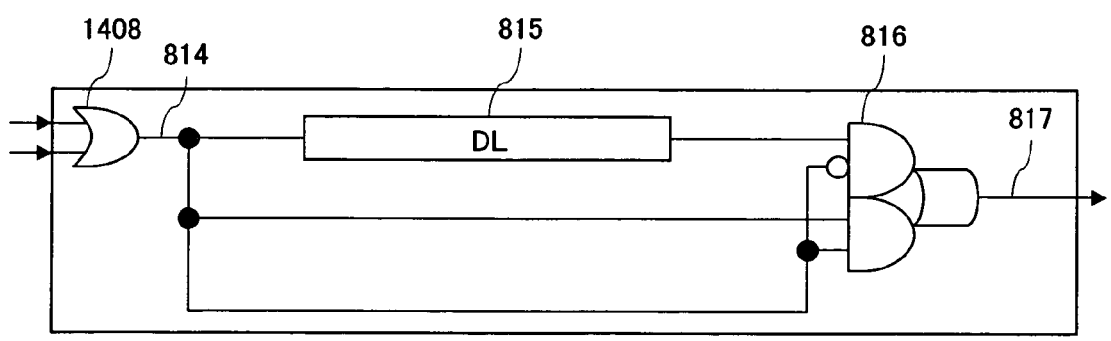

FIG. 14B shows an embodiment of the clock recovery circuit (CRC2).

That is, at the rising time of the signal which has received and outputted two inputs first by an OR element 1408, the signal is outputted within a short period of time, while at the falling time of the signal, the signal is outputted in a long delay time, and therefore, it is possible to lengthen a pulse width.

By changing the setting of the delay amount, it is possible to control a pulse width. Although the selector 816 shows now an example configured by the CMOS decoding gates, any type of selector may be used if it has the function as the selector.

Now, if a delay stage 815 is selected at the time smaller than the duty ratio of the external clock (ECLK), the ratio of the time in which the level is in a state 1 can be made smaller.

However, on the contrary, if selected at the time approximately equal to the duty ratio of the external clock, it is possible also to change the input of a narrow pulse width to a wide pulse width. That is, the clock recovery circuit (CRC2) in FIGS. 12 and 13 can be realized in this manner.

Next, an embodiment in the case where the integral multiples of the delay of one round-trip are generated only by the round-trips delay unit 112 by using both side edges of the clock will be described in detail with reference to the drawings.

FIG. 15 is a view of the embodiment corresponding to the phase synchronization in all the phase ranges by using the generating blocks 116 and 117 having the same configuration as the generating block 115 in the phase synchronous circuit of the present invention.

That is, a selector 102 (SEL1) which takes a reference clock (ERCLK1) as shown in FIG. 15 as one input from among two inputs and a delay array 103 (DL1) which takes a signal outputted from the selector 102 as an input are provided, and the output 104 of the delay array 103 is connected to the input of one side from among two inputs of the selector 102, and moreover, the selector 102 selects which input signal should be outputted from among the two inputs by a selector control circuit 105 (SELCON1).

Further, the synchronous circuit of the present invention has the reference clock 2 (ERCLK2) and a phase comparator array 106 (PCA) which takes at least one from among an output group from the delay stages configuring the delay array 103 (DL1) as an input, and a comparison result of the phases between the reference clock 2 and the input from the output group is outputted to an output signal control circuit 107 (OS-CON).

Further, the synchronous circuit of the present invention inputs an external clock to the pulse generating distribution circuit (PGDC2) and is converted into a pulse to allow an internal clock ICLK to synchronize so as to maintain a certain constant time relationship (time relationship equal to a time difference between the reference clock 1 and the reference clock 2) with the external clock ECLK, and moreover, those converted into the pulses are distributed in order to the three generating blocks 115, 116, and 117 respectively (ECLK1, ECLK2, and ECLK3), and based on the phase comparison result, the pulse signal distributed by each block is delayed, and each delayed signal (ICLK1, ICLK2,and ICLK3) is inputted to a clock recovery circuit (CRC3), and the clock is restored as the internal clock ICLK, and is outputted. The pulse generating circuit of the interior of the pulse generating distribution circuit (PGDC2) changes the duty ratio of the states 1 and 0 of the external input clock (ECLK).

Typically when it is presumed that the external clock (ECLK) has a duty ratio of 50%, the pulse generating circuit changes it to a duty ratio smaller (for example 10%) than this duty ratio. Thus, the duty ratio can be changed to the state 1 of the time much shorter as compared to the time of the state 1 of external clock (ECLK).

By so doing, when the signal round-trips around the round-trip delay block 112, it is possible to generate a pulse sufficiently shorter than the time of one round-trip, and for example, until the rising transition of the preceding signal returns to the same position again, it is possible to restore the signal of that position to a level (that is, 0) before the rising transition. If not restored to the level before the rising transition, the signal level at all the positions becomes 1, and therefore, this is to prevent inability of subsequent propagation of signal.

On the other hand, a clock recovery circuit (CRC3) plays a work of recovering a clock having the same duty ratio as the duty ratio of the external input clock (ECLK). A specific description will be made with the distribution pulse ECLK1 and the generating block 115 taken as an example.

A selector 108 which takes a pulse (ECLK1) inputted to the generating block 115 as one input from among two inputs and a delay array 109 (DL2) which takes a signal outputted from the selector 108 as an input are provided, and an output 110 of the delay array 109 is connected to another side input from among two inputs of the selector 108, and moreover, the selector 108 decides which input signal should be outputted from among the two inputs by a selector control circuit 111 (SELCON2).

Further, the output signal control circuit 107 (OS-CON) receives the signal 113 denoting a phase comparison result from the phase comparator array 106 (PCA) and the signal 114 from the predetermined position of the delay array 103 as an input.

Further, the pulse (ECLK1) distributed from the external clock selects at least one from among the signals having passed through the delay array 109 and outputted from a plurality of places, and this selected signal is outputted by the output signal control circuit 107.

Incidentally, though the delay arrays 103 and 109 are configured by a plurality of delay stages, the number of delay stages in the delay array is decided at this time such that the time during which the signal passes through the selector 102 and the delay array 103 becomes shorter than the time difference between the two reference clocks used in the present synchronous circuit.

Now, the operation of the above configuration will be described below in detail.

That is, a signal is allowed to pass through the first round-trip delay block 101 configured by the selector 102 and the delay array 103 for plural times, and further allowed to pass through the selector 102 and the delay stage of the interior of the delay array 103 for a certain number of stages, so that the signal in which the reference clock 1 (ERCLK1) is delayed for a certain time is generated. Next, when a plurality of phase comparators existing in the interior of the phase comparator array 106 all at once compare the temporal contexts of this delayed signal and the reference clock ERCLK2, and each comparator determines that they have the same phases as they satisfy a certain condition, the information (hereinafter referred to as "the number of target round-trips" and "the number of target stages") on the number of signal passage round-trips of round-trip delay block 101 and the positions (the number of stages) of the output from the delayed column 103 when they become the same phase is generated.

As a result, a total of the number of delay times that pass through the first round-trip delay block 101 for plural times (that is, the number of target round-trips), and moreover, pass through the certain number of delay stages (that is, the number of target stages) of the selector 102 and interior of delay array can be made equal to the time difference (phase difference) between the two reference clocks.

Next, the number of target round-trips and the number of target stages of the round-trip delay block 101 thus decided are transmitted to each of the output signal control circuits 107 (OS-CON)of the generating blocks 115, 116, and 117. Describing on the example in the generating block 115, the output signal control circuit 107 performs a control in such a manner that when a signal from the pulse (ECLK1) distributed from the external clock round-trips the round-trip delay block 112 just by the number of target round-trips, and after that, passes through the number of target stages only in the delay array 109, the output from the delay array 109 is outputted as a delay signal (ICLK1) for generating the internal clock ICLK.

The clock recovery circuit (CRC3) receives the outputs from the generating blocks 115, 116, and 117 and recovers and outputs the internal clock ICLK. In the interior of the phase comparator array 106, there exist a plurality of phase comparators, and each comparator compares the transition times of the signals with the output of each of the plurality of delay stages existing in the interior of the delay array 103 and the reference clock 2.

The number of output stages from the delay array 103 where both signals transit at the nearest timing is decided as the number of target stages. At the same time, the output control circuit 107 counts the number of signal passage round-trips of the round-trip delay block 101 up to that time, and this is outputted or stored as the number of target round-trips.

FIG. 16 shows a basic configuration of another phase synchronous circuit according to the present invention. That is, here is shown one phase comparator 501 (PC) in place of the phase comparator array 106(PCA) in FIG. 15.

A selector 1601 (SEL5) to select one from a plurality of delay outputs from the round-trip delay block 101 is provided. Which output from the plurality of delay outputs is selected by the selector 1601 is controlled by a control circuit 503 (RS-CON).

The phase comparator 501 outputs a signal showing whether a phase of the signal selected from the plurality of delay outputs is advancing or delayed (DN signal if advancing and UP signal if delayed) and the matching of phases (LOCK signal) to the reference clock 2.

Since the phase comparator exists only one set, the values of the number of target round-trips and the number of target stages are successively operated. When the matching of phases is detected by the phase comparator, the number of target round-trips and the number of target stages at the time when the phases have matched, which are the result measured by using the signal 504 from the predetermined position of the delay array 103 as to how many round-trips the reference clock 1 has round-tripped the round-trip delay block 101 up to that time, are informed to the output control circuit 107.

However, since such an operation requires many cycles in the reference clock 1 until the completion of synchronization, it takes a long time, thereby causing a problem similar to the conventional technique. Hence, in the present invention, the control circuit 503 is provided with a variable stage number control circuit 505 therein, which does not increase or decrease a control of the number of target stages one by one, but variably increases or decreases a control of the number target stages. This variable stage number control circuit 505 is shown in the above mentioned embodiment.

Figure 17A:
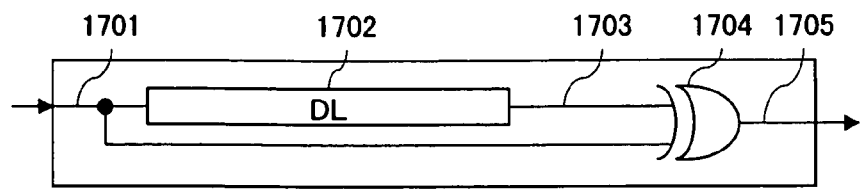
FIG. 17 is a view showing examples of circuit configurations of a pulse generator circuit, a clock recovery circuit, and a pulse distribution circuit.

FIG. 17A shows an embodiment of the pulse generating circuit of the interior of the pulse generating distribution circuit (PGDC2) shown in FIGS. 15 and 16. An input signal 1701 is delayed by a delay stage 1702 (DL), and an EXOR logic with its output 1703 and an input 1701 is generated by an EXOR element 1704 so as to become an output 1705.

Now, the operation of this circuit becomes as follows.

That is, when the input 1701 is 0 at first, the output 1703 is in a state of 0, and therefore, the output becomes 0. Next, when the input 1701 transits to 1, an output 1705 of the EXOR logic becomes 1 since the two inputs are 0 and 1. However, when the time elapses just by the delay stage, the output 1703 transits to 1, and therefore, the EXOR logic becomes 0, and this is outputted.

Figure 17B:
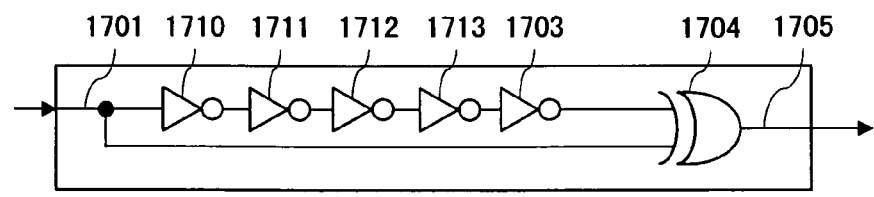

That is, the time whose output is 1 becomes a signal passage time of the delay stage, and it is seen that the pulse is generated. Incidentally, needless to say, the delay stage may be any type of the delay element. FIG. 17B is an example configuring the delay stage by the CMOS inverter.

Figure 17C:
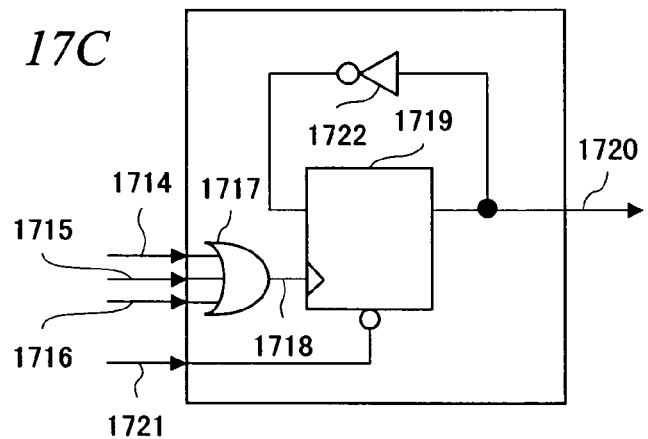

FIG. 17C shows an embodiment of the clock recovery circuit (CRC3) shown in FIGS. 15 and 16.

The OR logic with three input pulse signals 1714, 1715, and 1716 is generated by an OR element 1717, and becomes an output 1718. This generated signal 1718 is inputted to a clock input of a flip flop 1719, and is divided by this flip flop 1719, and becomes an output 1720. Now, the operation of this circuit becomes as follows. That is, when the input 1721 is 1 at first, and transits to 0 after the elapse of a certain time, the output of the flip flop 1719, that is, the output 1720 is reset to 0.

Further, the output of the flip flop 1719 is connected with the CMOS inverter 1722, and its output becomes the data input of the flip flop 1719. That is, when the output 1720 is reset to 0, the data input of the flip flop is inputted with 1 by the CMOS inverter 1722.

When the input pulse signals 1714, 1715, and 1716 are 0 at first, the output 1718 is 0, and the output of the flip flop does not change. At one point, when either of these three input pulse signals 1714, 1715, and 1716 transits to 1, the value of OR logic transits to 1 from 0, and this is outputted.

At this time, the output of the flip flop 1719 is 0, and when the data input is inputted with 1, the value of the output 1720 transits to 1 from 0, and the value is maintained. The CMOS inverter 1722 transits from 1 to 0, and the data input of the flip flop 1719 is inputted with 0.

Next, when an output 1718 of the OR logic is in a state of 0, when either of the three input pulse signals 1714, 1715, and 1716 transits to 1, the value of the OR logic transits to 1 from 0, and this is inputted to the clock input of the flip flop 1719, and the value of the output 1720 transits from 1 to 0, and the value is maintained.

That is, when the value inputted to the clock input of the flip flop 1719 transits to 1 from 0, the value of the output 1720 of the flip flop 1719 transits to 1 from 0 or from 1 to 0. That is, it is seen that the clock is recovered from the input pulse.

Figure 17D:
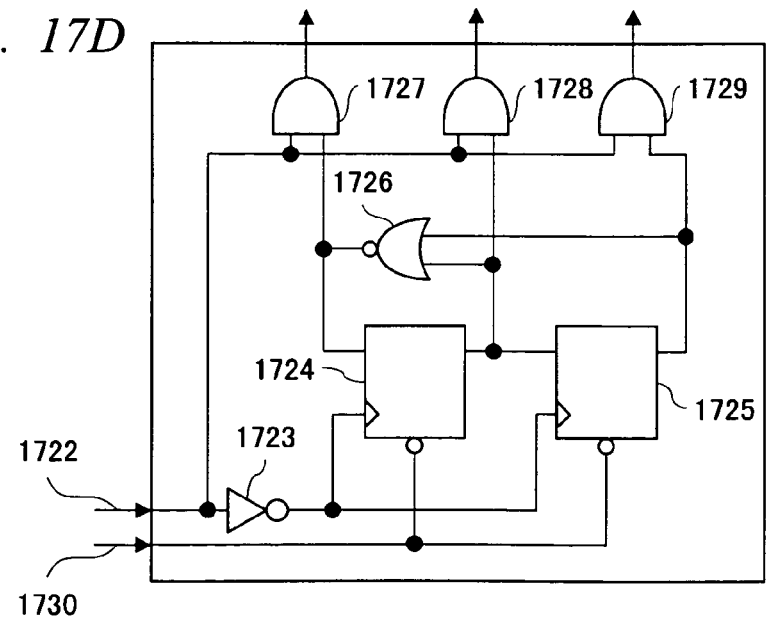

FIG. 17D shows an embodiment of the signal distribution circuit of the interior of the pulse generating distribution circuit (PGDC2) shown in FIGS. 15 and 16.

An input signal 1722 is connected to the inputs of one sides of the CMOS inverter 1723 and AND elements 1727, 1728, and 1729. The input signal reversed by the CMOS inverter 1723 is inputted to clock inputs of flip flops 1724 and 1725.

The flip flop has the value of its output renewed when the value of the clock input transits to 1 from 0. When the input signal 1722 transits from 1 to 0, the output of the CMOS inverter 1723, that is, the clock inputs of the flip flop 1724 and 1725 transit to 1 from 0.

At this time, the values of the outputs of the flip flops 1724 and 1725 are renewed. The output of the flip flop 1724 is connected to the inputs of one sides of the data input of the flip flop 1725 and the NOR element 1726 and another input of the AND element 1728.

The output of the flip flop 1725 is connected to another input of the NOR element 1726 and another input of the AND element 1729. The output of the NOR element 1726 is connected to the data input of the flip flop 1724 and another input of the AND element 1727.

When the value of the input 1730 of the reset signal and the like inputted from the outside transits to 0 from 1, the values of the outputs of the flip flops 1724 and 1725 become 0. At this time, since two inputs of the NOR element 1726 are inputted with 0, the value of the output becomes 1, and the data input of the flip flop 1724 is inputted with 1. This value of 1 transits to the output of the flip flop 1724 and the output of the flip flop 1725 in order each time the value of the input 1722 transits to 0 from 1, and corresponding to this transition, the AND elements 1727, 1728, and 1729 are put into a state in which the input 1722 can be outputted.

Now, the operation of this circuit becomes as follows.

That is, when the input 1730 is 1 at first, and transits to 0 after the elapse of a certain time, the values of the outputs of the flip flops 1724 and 1725 are reset to 0. As a result, the value of the output of the NOR element 1726 becomes 1, and the data input of the flip flop 1724 and the input of one side of the AND element 1727 are inputted with the value of 1.

Further, since the inputs of one side each of the AND elements 1728 and 1729 are inputted with 0, the input 1722 connected to the other inputs of the AND elements 1728 and 1729 are put into a state incapable of outputting. On the other hand, the input of one side of the AND element 1727 is inputted with 1, and the input 1722 connected to another input is put into a state capable of outputting. That is, the input 1722 passes through only the AND element 1727 from among the three connected AND elements, and is outputted.

Next, when the value of the input 1722 transits to 0 from 1, the value of 1 inputted to the date input of the flip flop 1724 is outputted, and is inputted to the data input of the flip flop 1725, the input of one side of the NOR element 1726, and the input of one side of the AND element 1728.

On the other hand, since the data input of the flip flop 1725 is inputted with 0, the output value remains 0 and does not change. As a result, the AND element 1728 is put into a state in which the input 1722 can be outputted. Further, the value of the output of the NOR element 1726 becomes 0, and this value is inputted to the data input of the flip flop 1724 and the input of one side of the AND element 1727.

That is, the input 1722 passes through the AND element 1728 only from among the three connected AND elements, and is outputted. Next, when the value of the input 1722 transits to 0 from 1, the value of 0 inputted to the data input of the flip flop 1724 is outputted, and is inputted to the data input of the flip flop 1725, the input of one side of the NOR element 1726, and the input of one side of the AND element 1728. On the other hand, since the data input of the flip flop 1725 is inputted with 1, the output is outputted with 1, and this value is inputted to the another input of the NOR element 1726 and the input of one side of the AND element 1729.

As a result, the AND element 1729 is put into a state in which the input 1722 can be outputted. Further, the value of the output of the NOR element 1726 remains 0 and does not change. That is, the input 1722 passes through the AND element 1729 only from among the connected three AND elements, and is outputted.

Next, when the value of the input 1722 transits to 0 from 1, the value of 0 inputted to the data input of the flip flop 1724 is outputted, and is inputted to the data input of the flip flop 1725, the input of one side of the NOR element 1726, and the input of one side of the AND element 1728.

On the other hand, since the data input of the flip flop 1725 is also inputted with 0, the output is outputted with 0, and this value is inputted to the another input of the NOR element 1726 and the input of one side of the AND element 1729.

As a result, the output of the NOR element 1726 becomes 1, and the AND element 1727 is put into a state in which the input 1722 can be outputted. That is, the input 1722 passes through the AND element 1727 only from among the three connected AND elements, and is outputted. Thus, according to the input 1722, the series of this operation are repeated, and the input 1722 is distributed in order to three outputs.

FIG. 18 is a timing chart of the phase synchronous circuit of the present invention shown in FIG. 15, in which it is presumed that the time difference between the reference clock 1 (ERCLK1) and the reference clock 2 (ERCLK2) is shifted by a three-quarter of one cycle T of the clock. The phase comparator array 106 (PCA) generates and outputs the signal 113 to the generating blocks 115, 116, and 117 at the timing of the reference clock 2 (ERCLK2), and the result of five stages is obtained, and this becomes the number of target stages. The number of round-trips up to this time (when ERCLK2 is inputted) is counted by the signal 114, and this number of round-trips becomes the number of the target round-trips.

The number of round-trips is now five. The output signal control circuit 107 (OS-CON) of the interior of each of the generating blocks 115, 116, and 117 is informed of the result by the signals 113 and 114 that the number of target stages is five and the number of target round-trips is five.

Based on this result, the signals of the ECLK1, ECLK2, and ECLK3, in which the external clock ECLK is generated by the pulse generating distribution circuit (PGDC2), round-trip the round-trip delay block 112 of the interior of the each generating block just by five round-trips which are the number of the target round-trips, and after that, in the sixth round-trip, when passing through five stages which are the number of target stages in the delay array 109, the output from the delay array 109 is received by the output signal control circuit 107 (OS-CON), and the delay signals ICLK1, ICLK2, and ICLK3 of the ECLK1, ECLK2, and ECLK3 are outputted. These three outputs ICLK1, ICLK2, and ICLK3 are inputted to the clock recovery circuit (CRC3), and the clock is recovered, and the result is outputted as an internal clock ICLK having a time difference of three-quarter of one cycle T with the external clock ECLK.

Figure 19A:
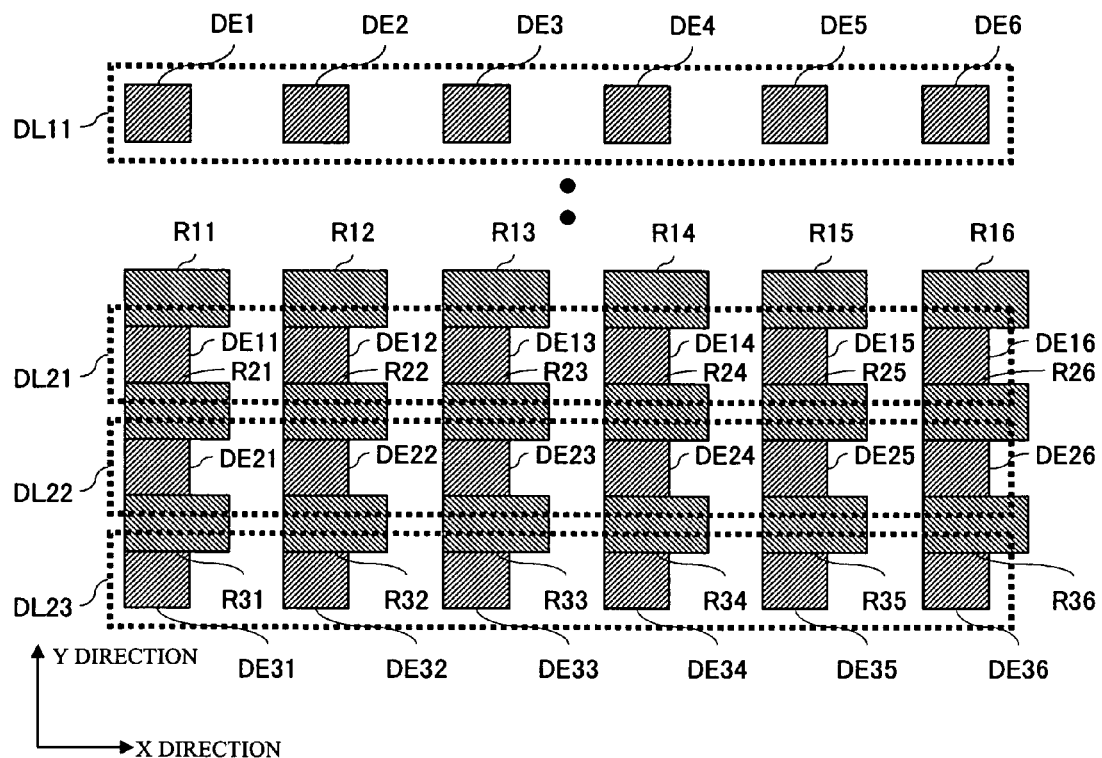
FIG. 19 is a view showing a layout example of a delay array part of the phase synchronous circuit.
Figure 19B:
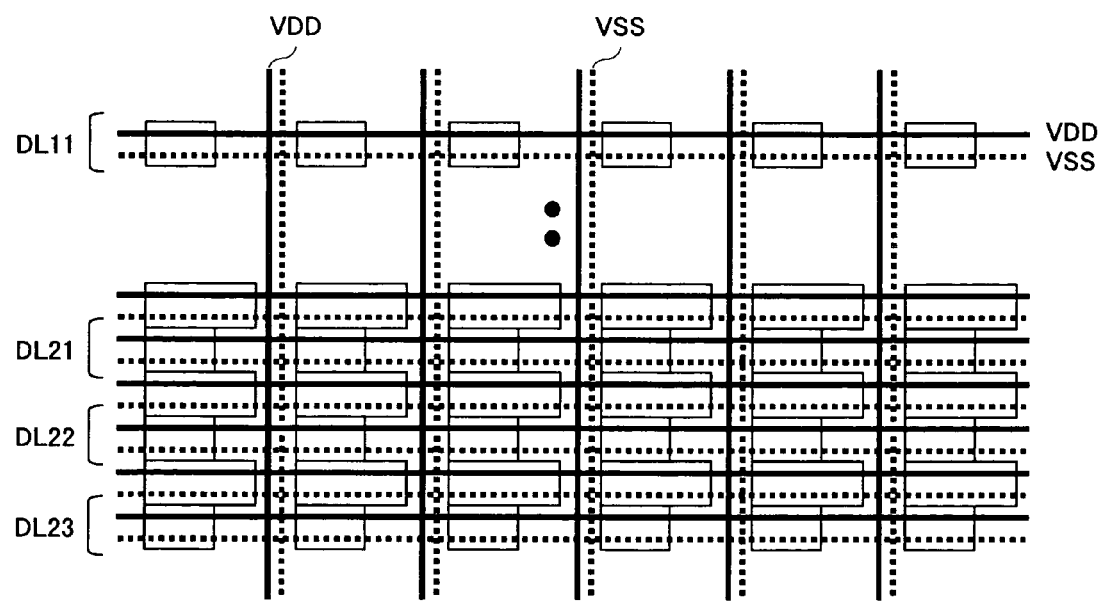

FIG. 19 shows a layout example of the delay array of the phase synchronous circuit shown in FIG. 15. In FIG. 19A is shown a cell layout configuring the delay arrays, and in FIG. 19B is shown a layout of power lines to provide a power to the delay arrays. The cell delay array DL11 is equivalent to the delay array 103 of FIG. 15, and the delay arrays DL 21 to 23 are equivalent to the delay arrays 109 of the generating blocks 115 to 117, respectively. The delay array DL is configured by a delay element DE. In the figure, it is represented by a cell image. For example, the delay element DE can be configured by cells of a plurality of NAND circuits. The delay array DL11 is configured by a plurality of delay elements DE1 to DE6, and though not illustrated, the signals of the delay elements are delivered in order to the delay element of the subsequent stages. That is, the output of the delay element DE1 is inputted to the delay element DE2, and the output of the delay element DE2 is inputted to the delay element DE3, thereby forming a delay signal. This holds true with the delay arrays DL21 to DL23. Further, adjacent to the delay arrays DL21 to DL23, resister circuits R are provided. The resistor circuit R indicates a synchronized delay stage, and from there, the synchronized delay signal can be taken out. Incidentally, FIG. 19 shows and focuses on a layout of the part relating to the delay array, and around the periphery of this layout and between the delay arrays DL11 and DL21, control circuits and the like are disposed.

Further, FIG. 19B shows a power line VDD by a solid line, and a power line VSS by a broken line. The power lines are disposed in a mesh pattern, and extending in an X direction is a first layer wiring, and extending in a Y direction is a second layer wiring to strengthen a power supply.

It is desirable that the delay arrays DL11 and DL21 to DL23 are disposed with each delay element DE lined up thus in the X direction. This is because a delay amount of each delay element is affected by wiring capacity between delay elements. To equalize the delay amount of each delay element, it is desirable to equalize a wiring length (electric length) connecting between each delay elements. Hence, the position in the X direction of each delay element is aligned and disposed. Further, in the layout of FIG. 19, to strengthen the power supply for each delay element, a second layer wiring is disposed between the delay elements. As a result, the effect of the power supply drop at the time when the delay element is operated can be held back to the minimum. Incidentally, the example of FIG. 19 shows that the second layer wiring is disposed between all the delay elements. However, the wiring may be disposed, for example, for every plural delay elements. In this case, while it is possible to compress the disposition between the delay elements, even in that case, it is necessary that the wiring is laid out in such a manner that the wiring length between the delay elements is equalized so that the delay amount of the delay element is not changed.

In the foregoing, the invention made by the inventors of the present invention has been concretely described based on the embodiments. However, it is needless to say that the present invention is not limited to the foregoing embodiments and various modifications and alterations can be made within the scope of the present invention.

INDUSTRIAL APPLICABILITY

The present invention is suitable for low power consumption of a phase synchronous circuit and miniaturization technique used for semiconductor integrated circuit devices of various types such as microprocessor and signal processing processor, and various memories or cards such as volatile/non-volatile memories.

The invention claimed is:

1. A phase synchronous circuit; comprising:
   a first delay array;
   a first selector that selectively inputs either one of a first reference clock and the outputs of the first delay array to the first delay array;
   a plurality of phase comparators that perform a phase comparison with each delay stage included in the first delay array and a second reference clock;
   a second delay array;
   a second selector that selectively inputs either one of the outputs of an external clock and the second delay array to the second delay array; and
   an output control circuit that selectively outputs an output outputted from each delay stage of the second delay array as an internal clock,
   wherein the output control circuit grasps a number of round-trips and a number of stages of the first delay array required to make a delay signal of the first reference clock generated by the first delay array synchronize with the second reference clock, and outputs the delay signal by the second delay array of the external clock corresponding to the grasped number of round-trips and number of delay stages as the internal clock.

2. The phase synchronous circuit according to claim 1, comprising:
   a pulse generating circuit that changes a duty ratio of the external clock and inputs it to the second selector;
   a clock recovery circuit that changes a duty ratio of the output of the output control circuit and outputs it as the internal clock; and
   a delay circuit that delays the external clock for a predetermined time and inputs it to the first selector,
   wherein the delay time by the delay circuit is equivalent to the delay time by the pulse generating circuit and the clock recovery circuit.

3. The phase synchronous circuit according to claim 1, wherein the delay time of each delay stage included in the first delay array and the second delay array is set with accuracy corresponding to the highest frequency permitted by the phase synchronous circuit.

4. The phase synchronous circuit according to claim 1, wherein the first reference clock and the second reference clock are the same with each other.

5. A phase synchronous circuit, comprising:
   a first delay array;
   a first selector that selectively inputs either one of the outputs of a first reference clock and the first delay array to the first delay array;
   a phase comparator that performs a phase comparison between a delay signal by the first delay array of the first reference clock and a second reference clock;
   a delay control circuit that controls a delay amount of the delay signal inputted to the phase comparator;
   a second delay array;
   a second selector that selectively inputs either one of the outputs of an external clock and the second delay array to the second delay array; and
   an output control circuit that selectively outputs an output outputted from each delay stage of the second delay array as an internal clock,
   wherein the output control circuit grasps a number of round-trips and a number of stages of the first delay array required to make a delay signal of the first reference clock generated by the first delay array synchronize with the second reference clock, and outputs the delay signal by the second delay array of the external clock according to the grasped number of round-trips and number of delay stages as the internal clock, and
   wherein the delay control circuit variably controls a delay amount of the delay signal inputted to the phase comparator.

6. The phase synchronous circuit according to claim 5, comprising:
   a pulse generating circuit that changes a duty radio of the first reference clock and inputs it to the second selector;
   a clock recovery circuit that changes a duty ratio of the output control circuit and outputs it as the internal clock; and
   a delay circuit that delays the external clock for a predetermined time and inputs it to the first selector,
   wherein the delay time by the delay circuit is equivalent to the delay time by the pulse generating circuit and the clock recovery circuit.

7. The phase synchronous circuit according to claim 5, wherein the delay time of each delay stage included in the first delay array and the second delay array is set with accuracy corresponding to the highest frequency permitted by the phase synchronous circuit.

8. The phase synchronous circuit according to claim 5, wherein the first reference clock and the second reference clock are the same with each other.

9. A phase synchronous circuit configured by first, second, third, and fourth selectors, first, second, third and fourth delay arrays, first, second, third, and fourth selector control circuits, a distribution circuit, a synthesizing circuit, a phase comparator array, and first, second and third output control circuits, wherein the first selector has one of its two inputs inputted with a first reference clock, and the other input is connected to an output of the first delay array, and from among the two inputs, which input should be outputted is selected by the first selector control circuit, wherein the first delay array has an input connected with the output of the first selector, and an output connected with one input from the two input of the first selector, wherein the phase comparator array takes a second reference clock and an output group from the delay stage configuring the first delay array as an input, and outputs a comparison result of the phases between these two inputs to the output signal control circuit, wherein the distribution circuit distributes and outputs an external clock to the second selector, the third selector, and the fourth selector, wherein the second selector has one of the two inputs inputted with one of the external clock, and the other input is connected with the output of the second delay array, and which signal from among the two inputs should be outputted is selected by the second selector control circuit, wherein the second delay array has an input connected with the output of the second selector, and an output connected with one input from among the two inputs of the second selector, wherein the first output signal control circuit selects at least one of the two outputs from the second delay array by using the comparison result from the phase comparator array, and outputs this selected signal after the distributed external clock round-trips the second selector and the second delay array for plural times, wherein the third selector has one of its two inputs inputted with the other of the distributed external clock, and the other input is connected with the output of the third delay array, and which signal from among the two inputs should be outputted is selected by the third selector control circuit, wherein the third delay array has an input connected with the output of the third selector, and an output connected with one input from the two inputs of the third selector, wherein the second output signal control circuit selects at least one of the outputs from the third delay array by using the comparison result from the phase comparator array, and outputs this selected signal after the distributed external clock round-trips the third selector and the third delay array for plural times, wherein the fourth selector has one of its two inputs inputted with the other of the distributed external clock, and the other input is connected with the output of the fourth delay array, and which signal from among the two inputs should be outputted is selected by the fourth selector control circuit, wherein the fourth delay array has an input connected with the output of the fourth selector, and an output connected with one input from the two inputs of the fourth selector, wherein the third output signal control circuit selects at least one of the outputs from the fourth delay array by using the comparison result from the phase comparator array, and outputs this selected signal after the distributed external clock round-trips the fourth selector and the fourth delay array for plural times, and wherein the synthesizing circuit synthesizes each output, and outputs it.

10. The phase synchronous circuit according to claim 9, wherein the first reference clock, the second reference clock, and the external clock are all the same.

* * * * *